United States Patent
Kawaguchi

(10) Patent No.: US 12,034,100 B2
(45) Date of Patent: Jul. 9, 2024

(54) SEMICONDUCTOR LIGHT-EMITTING DEVICE

(71) Applicant: PANASONIC CORPORATION, Osaka (JP)

(72) Inventor: Masao Kawaguchi, Kyoto (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 408 days.

(21) Appl. No.: 17/442,109

(22) PCT Filed: Oct. 7, 2019

(86) PCT No.: PCT/JP2019/039554
§ 371 (c)(1),
(2) Date: Sep. 22, 2021

(87) PCT Pub. No.: WO2020/194806
PCT Pub. Date: Oct. 1, 2020

(65) Prior Publication Data
US 2022/0165917 A1 May 26, 2022

(30) Foreign Application Priority Data

Mar. 22, 2019 (JP) ................. 2019-055631

(51) Int. Cl.
*H01L 33/40* (2010.01)
*H01L 33/44* (2010.01)
*H01L 33/50* (2010.01)

(52) U.S. Cl.
CPC .............. *H01L 33/40* (2013.01); *H01L 33/44* (2013.01); *H01L 33/508* (2013.01)

(58) Field of Classification Search
CPC ......... H01L 33/38; H01L 33/40; H01L 33/42; H01L 33/44; H01L 33/508; H01L 33/58; H01S 5/042; H01S 5/20; H01S 5/22
See application file for complete search history.

(56) References Cited

U.S. PATENT DOCUMENTS

| 5,499,261 A | 3/1996 | Welch et al. |
| 2007/0165685 A1* | 7/2007 | Mizuuchi .............. H01S 5/0625 372/50.1 |

(Continued)

FOREIGN PATENT DOCUMENTS

| JP | 2010-123726 A | 6/2010 |
| JP | 2010123726 A * | 6/2010 |

(Continued)

OTHER PUBLICATIONS

International Search Report issued in corresponding International Patent Application No. PCT/JP2019/039554, dated Dec. 24, 2019, with English translation.

*Primary Examiner* — Matthew C Landau
*Assistant Examiner* — Dmitriy Yemelyanov
(74) *Attorney, Agent, or Firm* — Rimon P.C.

(57) ABSTRACT

A semiconductor light-emitting device includes: a semiconductor light-emitting element; a submount configured to have mounted thereon the semiconductor light-emitting element; and the like. The semiconductor light-emitting element includes a light guide layer, and a taper waveguide configured to cause light generated in the light guide layer to propagate. An equivalent refractive index of the taper waveguide is, in a predetermined range from an end face of the taper waveguide, higher at a center in a width direction of the taper waveguide than on outer sides in the width direction of the taper waveguide.

7 Claims, 14 Drawing Sheets

(56) References Cited

U.S. PATENT DOCUMENTS

| | | | |
|---|---|---|---|
| 2015/0063392 A1* | 3/2015 | Takayama | H01S 5/0287 372/45.01 |
| 2018/0152001 A1 | 5/2018 | Fukuda | |
| 2018/0301591 A1* | 10/2018 | Yamanishi | H01L 33/20 |

FOREIGN PATENT DOCUMENTS

| | | |
|---|---|---|
| JP | 2015-138894 A | 7/2015 |
| JP | 2018-085468 A | 5/2018 |

\* cited by examiner

FIG. 1A  EMBODIMENT 1
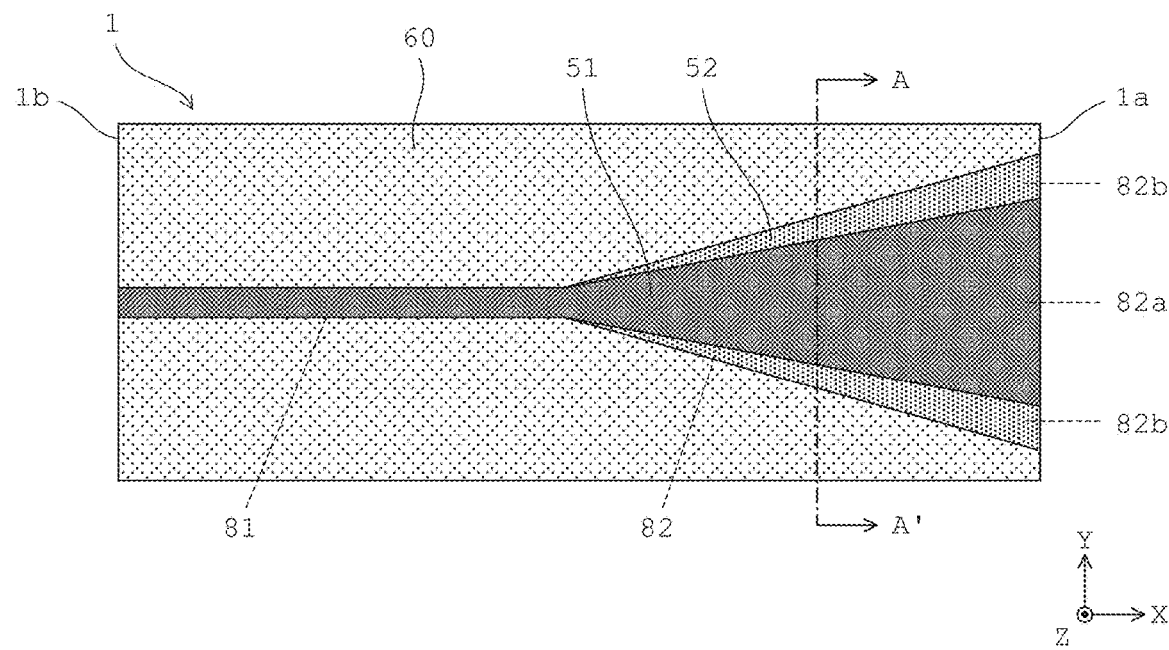
FIG. 1B
A-A' CROSS-SECTIONAL VIEW
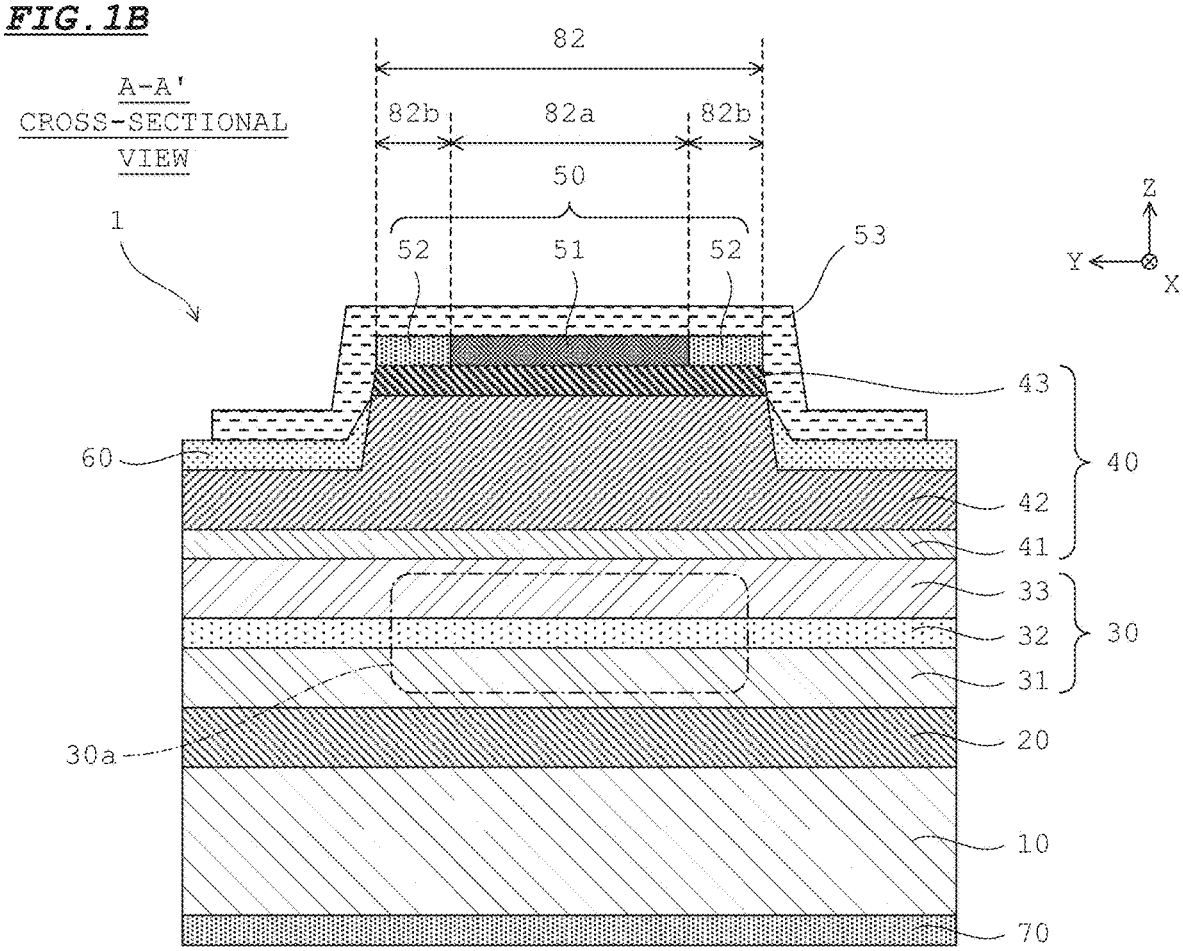

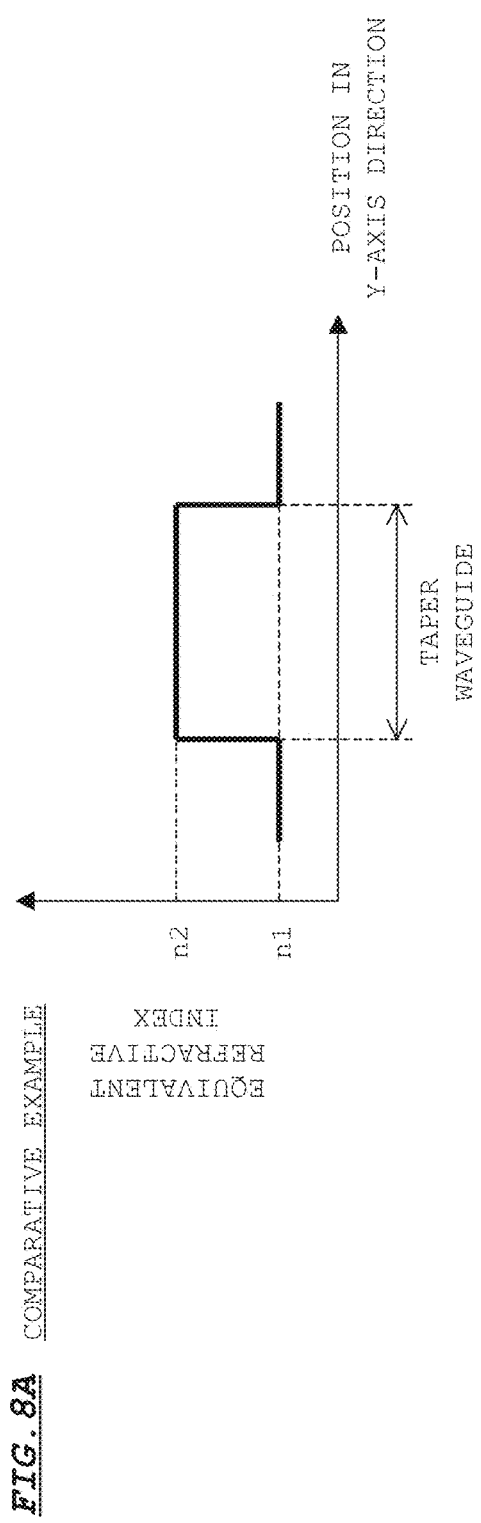
FIG. 8A COMPARATIVE EXAMPLE
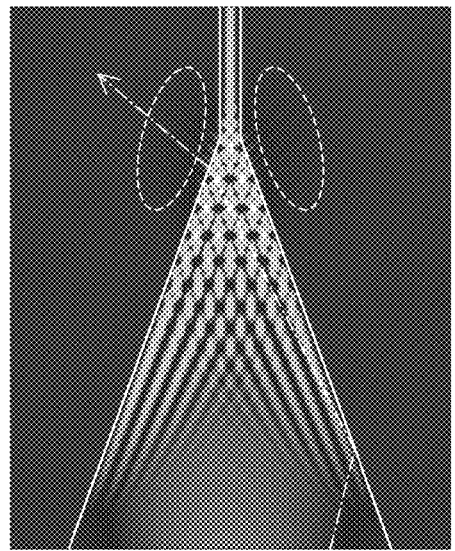
FIG. 8C COMPARATIVE EXAMPLE
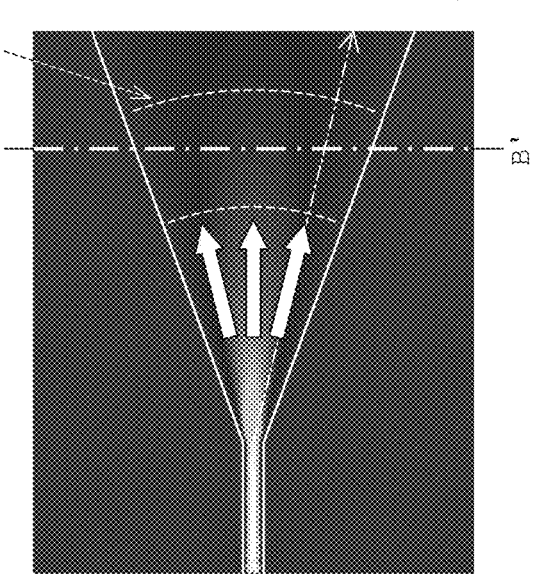
FIG. 8B COMPARATIVE EXAMPLE

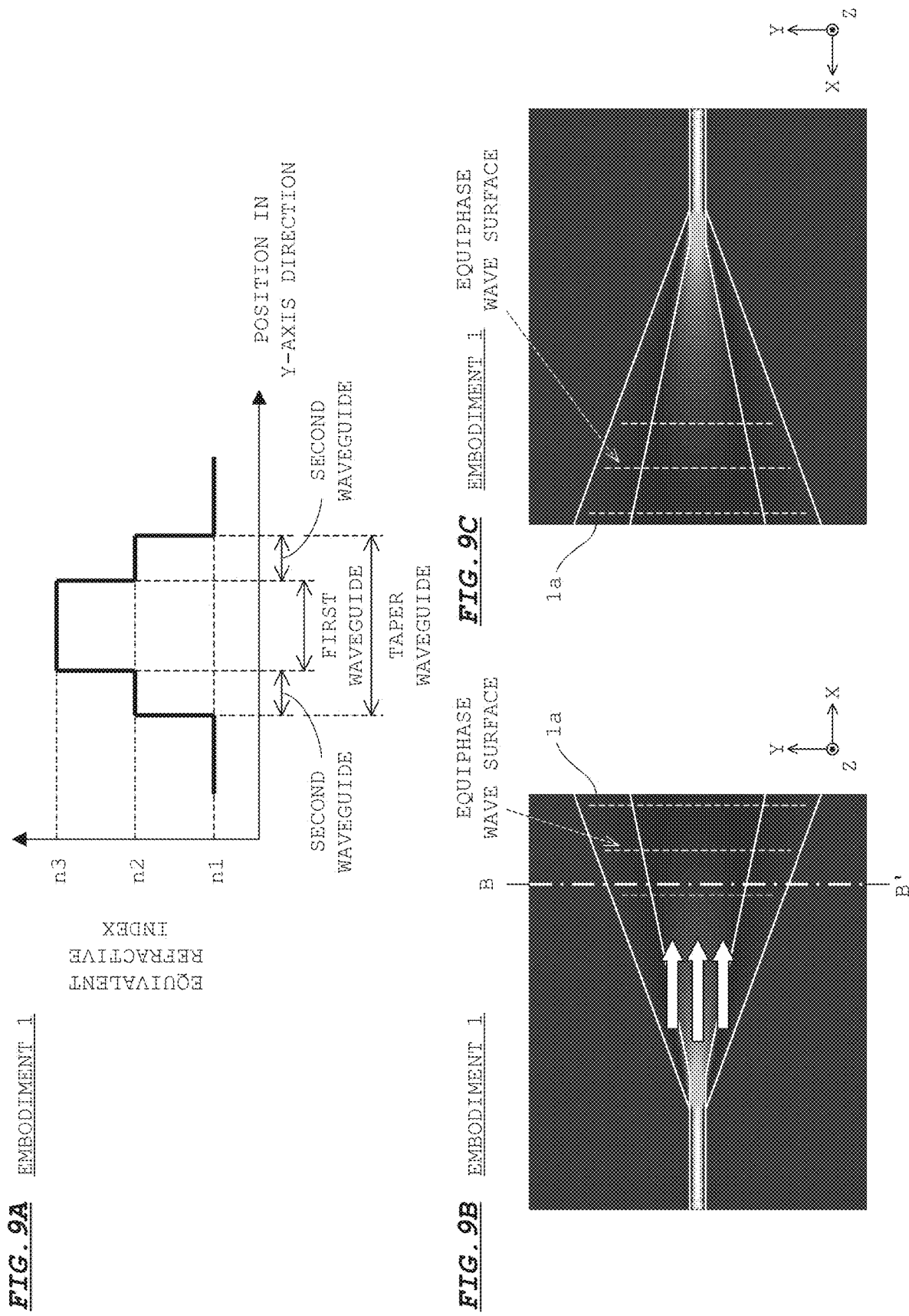

MODIFICATION

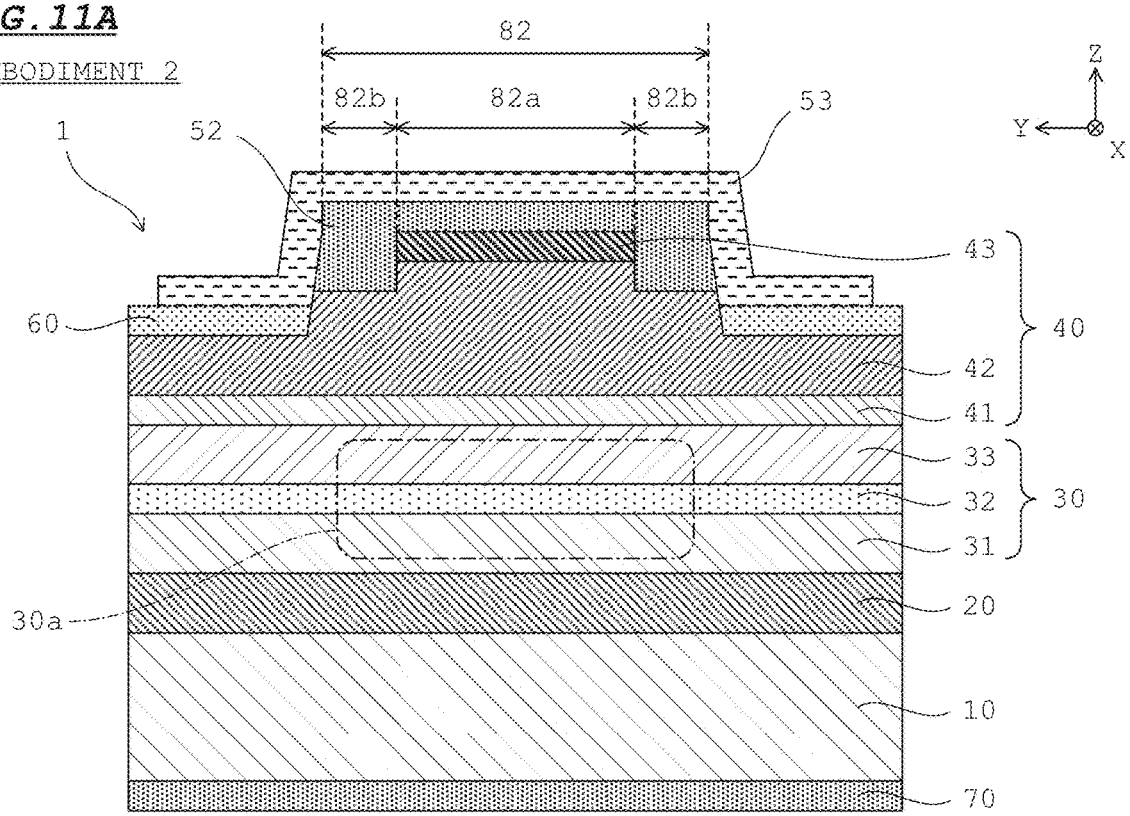
FIG. 11A EMBODIMENT 2
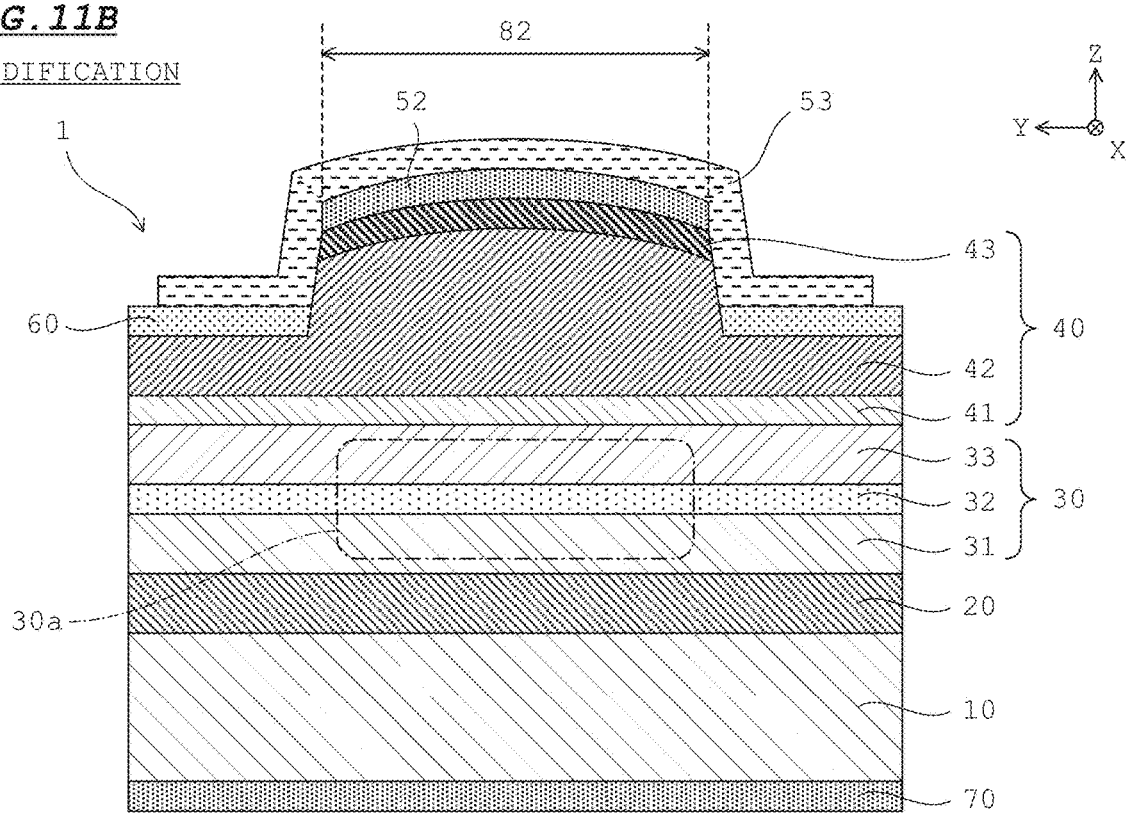
FIG. 11B MODIFICATION

FIG.12A  EMBODIMENT 3
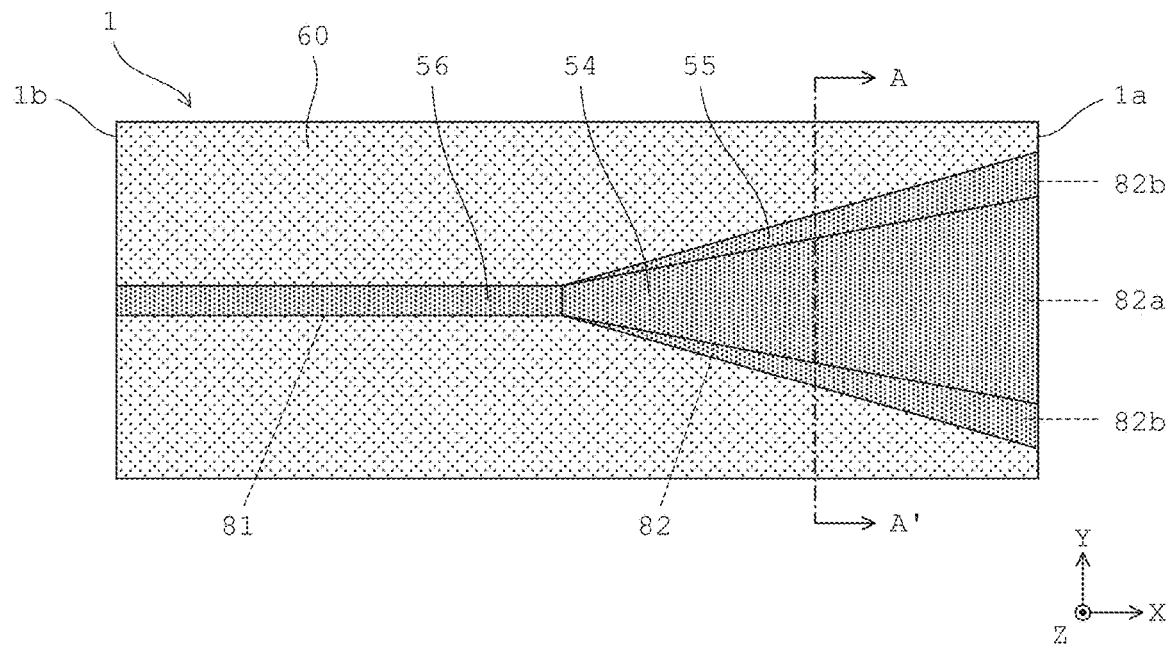
FIG.12B
A-A' CROSS-SECTIONAL VIEW
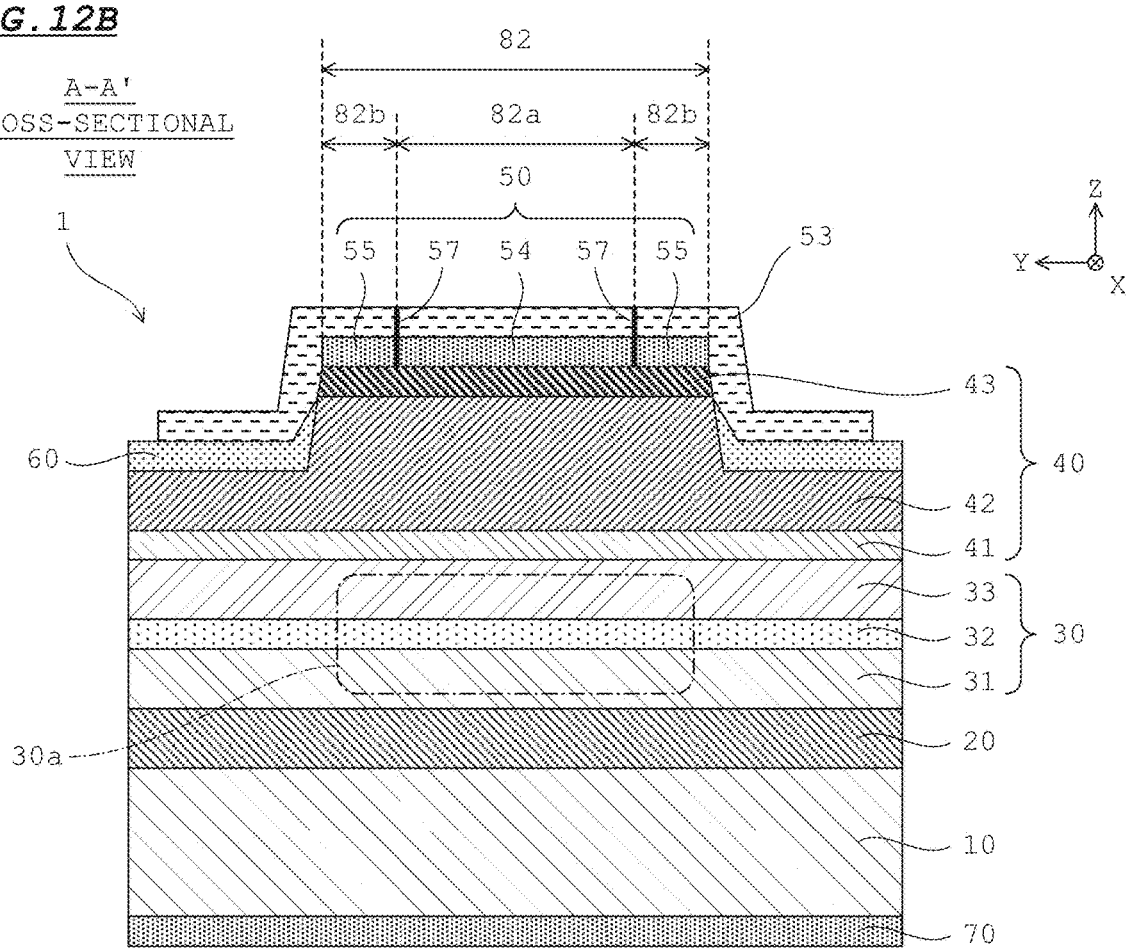

FIG.14A    EMBODIMENT 4
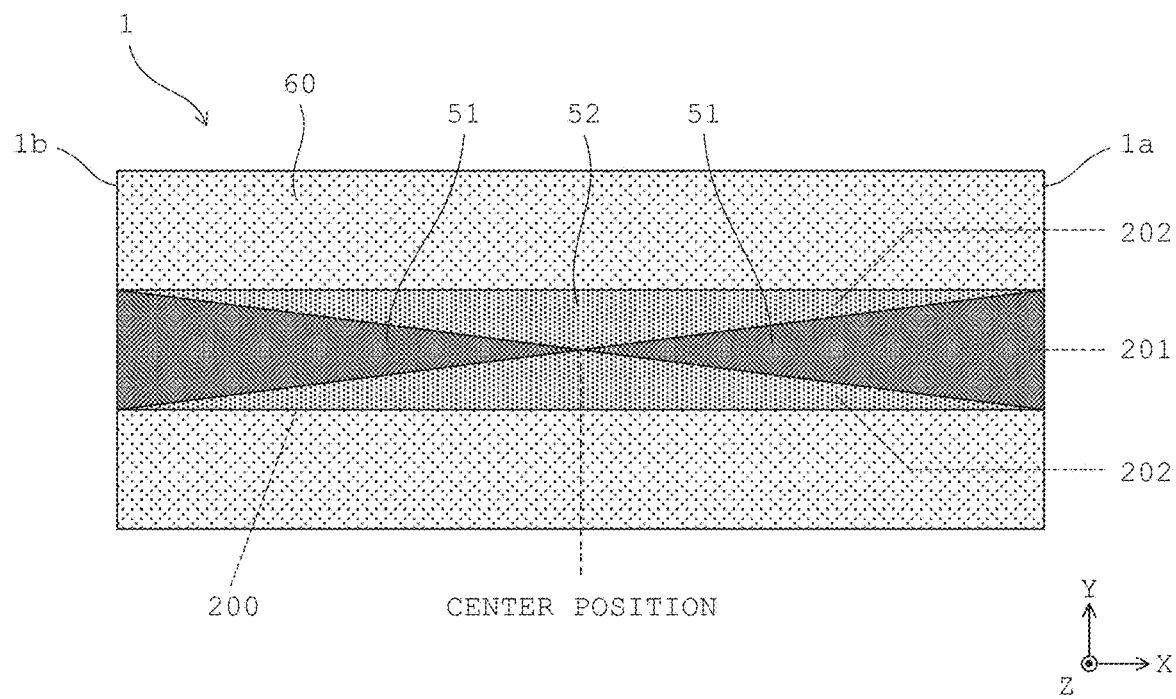
FIG.14B    MODIFICATION
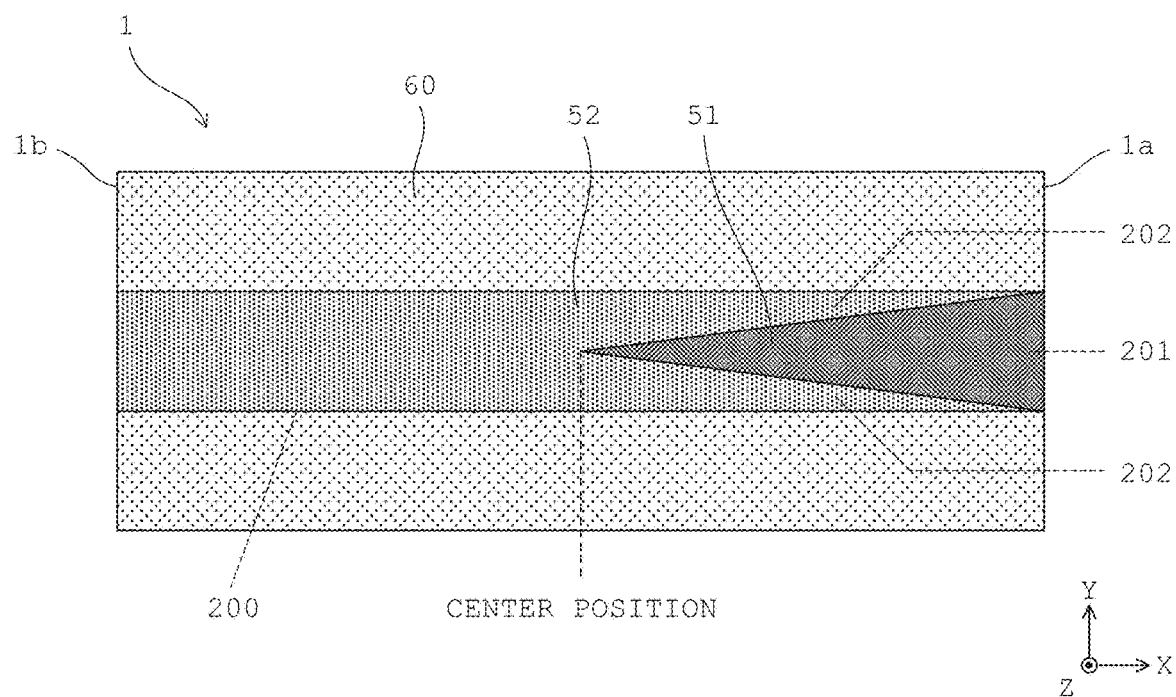

SEMICONDUCTOR LIGHT-EMITTING DEVICE

CROSS-REFERENCE OF RELATED APPLICATIONS

This application is the U.S. National Phase under 35 U.S.C. § 371 of International Patent Application No. PCT/JP2019/039554, filed on Oct. 7, 2019, which in turn claims the benefit of Japanese Application No. 2019-055631, filed on Mar. 22, 2019, the entire disclosures of which Applications are incorporated by reference herein.

TECHNICAL FIELD

The present invention relates to a semiconductor light-emitting device, and is suitable to be used in, for example, processing and the like of products.

The present application is a patent application subject to Article 17 of the Industrial Technology Enhancement Act on a commissioned research under "Development of advanced laser processing with intelligence based on high-brightness and high-efficiency laser technologies/Development of new light-source/elemental technologies for advanced processing/Development of GaN-based high-power high-beam quality semiconductor lasers for highly-efficient laser processing" of the New Energy and Industrial Technology Development Organization for the fiscal year 2016.

BACKGROUND ART

In recent years, semiconductor light-emitting devices have been used in processing of various products. In such a case, in order to enhance the processing quality, light emitted from a semiconductor light-emitting device preferably has a high output power and is in a fundamental mode, with light in higher order modes cut. PATENT LITERATURE 1 below describes a semiconductor light-emitting device that includes: a linear waveguide having a small width for cutting light in higher order modes; and a taper-shaped waveguide for amplifying light in a fundamental mode.

CITATION LIST

Patent Literature

[PTL 1] U.S. Pat. No. 5,499,261

SUMMARY OF THE INVENTION

Problems to be Solved by the Invention

In the semiconductor light-emitting device described in PATENT LITERATURE 1 above, the wave front of light (forward wave) advancing from the linear waveguide toward the taper-shaped waveguide takes an arc shape in the taper-shaped waveguide. Accordingly, a part of light (backward wave) reflected at an end face on the taper-shaped waveguide side is incident at a high angle on the boundary of the taper-shaped waveguide, to be dissipated to the outside of the waveguide. This causes a situation where the emission efficiency of the semiconductor light-emitting device is unintendedly reduced.

In view of the above problem, an object of the present invention is to provide a semiconductor light-emitting device capable of enhancing the emission efficiency.

Solution to the Problems

A semiconductor light-emitting device according to a first aspect of the present invention includes: a light-emitting layer; and a waveguide configured to cause light generated in the light-emitting layer to propagate. Here, an equivalent refractive index of the waveguide is, in a predetermined range from an end face of the waveguide, higher at a center in a width direction of the waveguide than on an outer side in the width direction of the waveguide.

According to the semiconductor light-emitting device of the present aspect, the equivalent refractive index at the center in the waveguide is set to be higher than the equivalent refractive index on the outer sides in the waveguide. Therefore, the wave front of light that can be a spherical wave when the equivalent refractive index of the waveguide is constant can be close to a wave front in a planar shape. Through the adjustment of the equivalent refractive index in the waveguide as described above, the speed of light advancing at the center in the waveguide becomes slower than the speed of light advancing on the outer sides in the waveguide. Therefore, the optical propagation distance of light advancing at the center in the waveguide and the optical propagation distance of light advancing on the outer sides in the waveguide become substantially equal to each other. Accordingly, the phases of light advancing in the waveguide are aligned, and the wave front of light can be close to a wave front in a planar shape at the end face of the waveguide. Therefore, as for the incidence and reflection of light with respect to the end face, the phase of light (forward wave) incident on the end face and the phase of light (backward wave) reflected at the end face are optically in symmetry with respect to the end face, and thus, the light reflected at the end face can be suppressed from being dissipated from the waveguide. Accordingly, the light emission efficiency of the semiconductor light-emitting device can be enhanced.

A semiconductor light-emitting device according to a second aspect of the present invention includes: a light-emitting layer; a waveguide configured to cause light generated in the light-emitting layer to propagate; a first electrode disposed at a position corresponding to a center region in a width direction of the waveguide; and a second electrode insulated from the first electrode and disposed at a position corresponding to a region on an outer side in the width direction of the waveguide.

According to the semiconductor light-emitting device of the present aspect, when current controls are performed on the first electrode and the second electrode such that the current density of the first electrode is lower than the current density of the second electrode, the refractive index of the semiconductor layer in the waveguide corresponding to the first electrode becomes greater than the refractive index of the semiconductor layer in the waveguide corresponding to the second electrode. Accordingly, the equivalent refractive index at the center in the waveguide can be set to be higher than the equivalent refractive index on the outer sides in the waveguide. Therefore, similar to the first aspect, the phases of light advancing in the waveguide are aligned, and thus, the phases of light passing through the waveguide and reflected at the end face of the waveguide are also aligned. Therefore, the light reflected at the end face can be suppressed from being dissipated from the waveguide, and the light emission efficiency of the semiconductor light-emitting device can be enhanced.

In the first and second aspects above, the "equivalent refractive index" is a refractive index that substantially acts on light, and is a refractive index defined for light that propagates in the semiconductor light-emitting device.

Advantageous Effects of the Invention

As described above, according to the present invention, a semiconductor light-emitting device capable of enhancing emission efficiency can be provided.

The effects and the significance of the present invention will be further clarified by the description of the embodiment below. However, the embodiments below are merely examples for implementing the present invention. The present invention is not limited to the embodiments below in any way.

BRIEF DESCRIPTION OF THE DRAWINGS

FIG. 1A is a top view schematically showing a configuration of a semiconductor light-emitting element according to Embodiment 1. FIG. 1B is a cross-sectional view schematically showing the configuration of the semiconductor light-emitting element according to Embodiment 1.

FIG. 8A is a graph showing an equivalent refractive index of a taper waveguide according to a comparative example. FIGS. 8B, 8C each show a result of a wave-guiding simulation performed according to the comparative example.

FIG. 9A is a graph showing an equivalent refractive index of the taper waveguide according to Embodiment 1. FIGS. 9B, 9C each show a result of a wave-guiding simulation performed according to Embodiment 1.

FIG. 11A is a cross-sectional view schematically showing a configuration of a semiconductor light-emitting element according to Embodiment 2. FIG. 11B is a cross-sectional view schematically showing a configuration of a semiconductor light-emitting element according to a modification of Embodiment 2.

FIG. 12A is a top view schematically showing a configuration of a semiconductor light-emitting element according to Embodiment 3. FIG. 12B is a cross-sectional view schematically showing the configuration of the semiconductor light-emitting element according to Embodiment 3.

FIG. 14A is a top view schematically showing a configuration of a semiconductor light-emitting element according to Embodiment 4. FIG. 14B is a top view schematically showing a configuration of a semiconductor light-emitting element according to a modification of Embodiment 4.

Figure 2A:
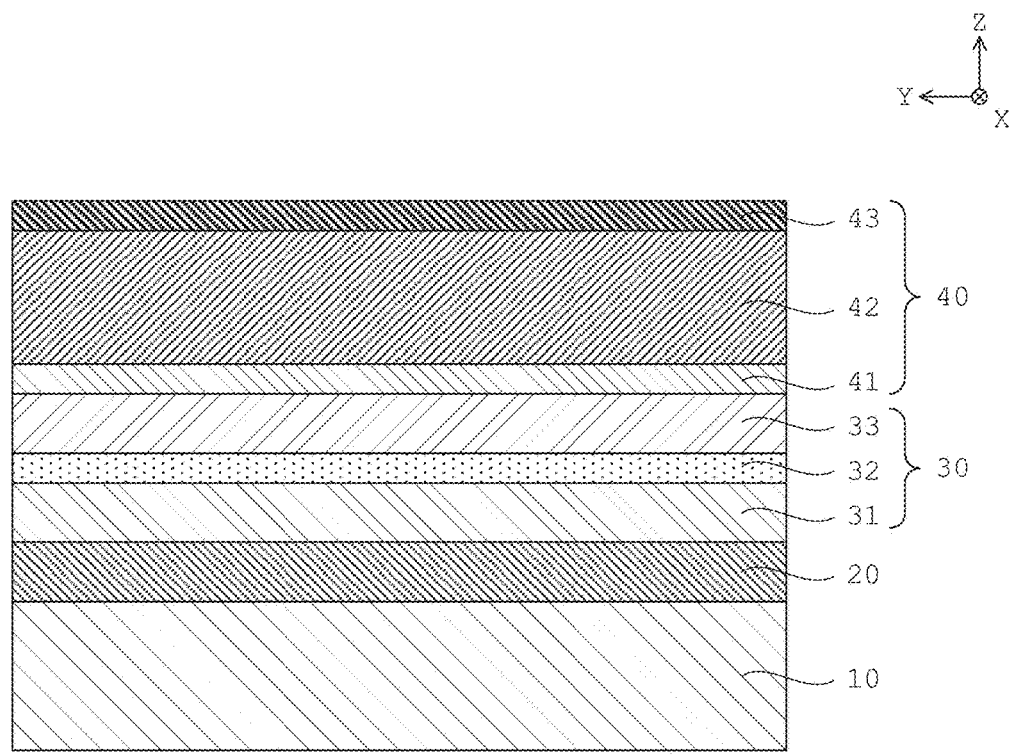
FIGS. 2A, 2B are each a cross-sectional view for describing a production method of the semiconductor light-emitting element according to Embodiment 1.

It should be noted that the drawings are solely for description and do not limit the scope of the present invention by any degree.

BEST MODE FOR CARRYING OUT THE INVENTION

Hereinafter, embodiments of the present invention will be described with reference to the drawings. For convenience, each drawing is provided with X, Y, and Z axes orthogonal to each other. The X-axis direction is the propagation direction of light in a waveguide, the Y-axis direction is the width direction of the waveguide. The Z-axis direction is the lamination direction of layers that form a semiconductor light-emitting element.

Embodiment 1

FIG. 1A is a top view schematically showing a configuration of a semiconductor light-emitting element 1, and FIG. 1B is a cross-sectional view schematically showing the configuration of the semiconductor light-emitting element 1. In FIG. 1A, for convenience, a pad electrode 53 is not shown. FIG. 1B is a cross-sectional view in the X-axis positive direction of the semiconductor light-emitting element 1 cut along A-A' in FIG. 1A.

As shown in FIG. 1A, the semiconductor light-emitting element 1 is provided with a straight waveguide 81 and a taper waveguide 82. The straight waveguide 81 and the taper waveguide 82 are connected to each other at a position near the center of the semiconductor light-emitting element 1. The straight waveguide 81 extends linearly in the X-axis direction, and the taper waveguide 82 has a width that is increased in the Y-axis direction in accordance with advancement in the X-axis positive direction. The taper waveguide 82 has a shape that is in symmetry in the Y-axis direction. The straight waveguide 81 and the taper waveguide 82 have an action of restricting advancement of light to the outside of these waveguides in the Y-axis direction.

The taper waveguide 82 includes: a first waveguide 82a provided at the center in the Y-axis direction; and second waveguides 82b provided on both sides in the Y-axis direction with respect to the first waveguide 82a. The first waveguide 82a and the two second waveguides 82b are formed in symmetry with respect to the central axis (the axis that passes the center position in the Y-axis direction and is parallel to the X-axis) of the taper waveguide 82. The first waveguide 82a and the second waveguides 82b each have a width that is increased in the Y-axis direction in accordance with advancement in the X-axis positive direction on the X-Y plane.

An end face 1a is an end face, of the taper waveguide 82, that is positioned on the X-axis positive side. The end face 1a is also an end face on the emission side of the semiconductor light-emitting element 1. An end face 1b is an end face, of the straight waveguide 81, that is positioned on the X-axis negative side, and is also an end face on the reflection side of the semiconductor light-emitting element 1. Hereinafter, light that advances from the end face 1b side toward the end face 1a will be referred to as a "forward wave", and light that advances from the end face 1a side toward the end face 1b will be referred to as a "backward wave".

When the forward wave advances in the X-axis positive direction in the straight waveguide 81, light in higher order modes is cut and light in the fundamental mode remains. Then, the forward wave with the light in the higher order modes cut in the straight waveguide 81 advances to the taper waveguide 82 and is amplified in the taper waveguide 82. At this time, since the taper waveguide 82 is formed in a taper shape, temperature increase in the taper waveguide 82 is suppressed.

When the forward wave reaches the end face 1a, a part of the forward wave is emitted, as emission light, in the X-axis positive direction from the end face 1a, and a part of the forward wave is reflected at the end face 1a to be a backward wave. When the backward wave advances to the straight waveguide 81 through the taper waveguide 82 and reaches the end face 1b, most of the backward wave is reflected at the end face 1b to be a forward wave. In this manner, light generated in the semiconductor light-emitting element 1 is amplified between the end face 1a and the end face 1b, and then emitted from the end face 1a.

As shown in FIG. 1B, the semiconductor light-emitting element 1 includes a substrate 10, a first semiconductor layer 20, a light guide layer 30, a second semiconductor layer 40, an electrode part 50, the pad electrode 53, an insulation film 60, and an n-side electrode 70.

The first semiconductor layer 20 is disposed above the substrate 10. The first semiconductor layer 20 is an n-side clad layer.

The light guide layer 30 is disposed above the first semiconductor layer 20. The light guide layer 30 has a laminated structure in which an n-side light guide layer 31, an active layer 32, and a p-side light guide layer 33 are laminated from the bottom in this order. A light-emitting region 30a is disposed at a position corresponding to the straight waveguide 81 and the taper waveguide 82, and is a region in which most of the light to be emitted from the semiconductor light-emitting element 1 is generated and propagates.

The second semiconductor layer 40 is disposed above the p-side light guide layer 33. The second semiconductor layer 40 has a laminated structure in which an electron barrier layer 41, a p-side clad layer 42, and a p-side contact layer 43 are laminated from the bottom in this order.

The electrode part 50 is disposed above the p-side contact layer 43. The electrode part 50 is a p-side electrode, and is an ohmic electrode that is in ohmic contact with the p-side contact layer 43.

The electrode part 50 is composed of a first electrode 51, and second electrodes 52 provided on the Y-axis positive side and the Y-axis negative side of the first electrode 51. The first electrode 51 is disposed at a position corresponding to the first waveguide 82a, and the second electrodes 52 are disposed at positions corresponding to the second waveguides 82b. The first electrode 51 is a transparent (ITO) electrode having a refractive index higher than that of the second electrodes 52.

The electrode part 50 at the position corresponding to the straight waveguide 81 is composed only of the first electrode 51. The first electrode 51 corresponding to the straight waveguide 81 and the first electrode 51 corresponding to the taper waveguide 82 are integrally formed as the ITO electrode. It should be noted that the first electrode 51 corresponding to the straight waveguide 81 and the first electrode 51 corresponding to the taper waveguide 82 may be formed as separate ITO electrodes. In this case, the first electrode 51 corresponding to the straight waveguide 81 and the first electrode 51 corresponding to the taper waveguide 82 are electrically connected to each other and are provided without any gap therebetween.

The first electrode 51 is formed from a material having a refractive index higher than that of each second electrode 52. That is, the electrode part 50 is configured such that the refractive index at the position corresponding to the first waveguide 82a is higher than that at the positions corresponding to the second waveguides 82b. The action due to the refractive indexes of the electrode part 50 will be described later with reference to FIG. 7.

The pad electrode 53 is shaped so as to be longer in the Y-axis direction than the straight waveguide 81 and the taper waveguide 82, and is in contact with the electrode part 50 and the insulation film 60.

The insulation film 60 is disposed above the p-side clad layer 42 on the outer sides in the Y-axis direction of the straight waveguide 81 and the taper waveguide 82, in order to confine the light from the light-emitting region 30a.

The n-side electrode 70 is disposed below the substrate 10, and is an ohmic electrode in ohmic contact with the substrate 10.

Next, a production method of the semiconductor light-emitting element 1 is described with reference to FIG. 2A to FIG. 5B. FIG. 2A to FIG. 5B are cross-sectional views similar to that in FIG. 1B.

As shown in FIG. 2A, the first semiconductor layer 20, the light guide layer 30, and the second semiconductor layer 40 are sequentially formed through Metalorganic Chemical Vapor Deposition (MOCVD method) on the substrate 10, which is an n-type hexagonal GaN substrate of which the main face is a (0001) plane.

Specifically, an n-type Al0.03GaN clad layer is grown by 2 μm as the first semiconductor layer 20 on the substrate 10 having a thickness of 400 μm. Subsequently, an i-GaN layer is grown by 0.2 μm as the n-side light guide layer 31. Further, In0.008GaN is grown by 40 nm as the n-side light guide layer 31. Then, In0.02GaN is grown by 13 nm as the n-side light guide layer 31. On top of this, In0.07GaN is grown by 7.5 nm as the active layer 32. Subsequently, In0.02GaN is grown by 13 nm as the p-side light guide layer 33. Further, In0.008GaN is grown by 40 nm as the p-side light guide layer 33. Further, In0.0003GaN is grown by 60 nm as the p-side light guide layer 33. Then, GaN is grown by 5 nm as the p-side light guide layer 33.

Subsequently, Al0.35GaN is grown by 5 nm as the electron barrier layer 41. Subsequently, a 0.6 μm strained superlattice layer is grown, as the p-side clad layer 42, by repeating 200 cycles of a 1.5 nm p-Al0.0.06GaN layer and a 1.5 nm GaN layer. Subsequently, p-GaN having a thickness of 0.05 μm is grown as the p-side contact layer 43.

Figure 2B:
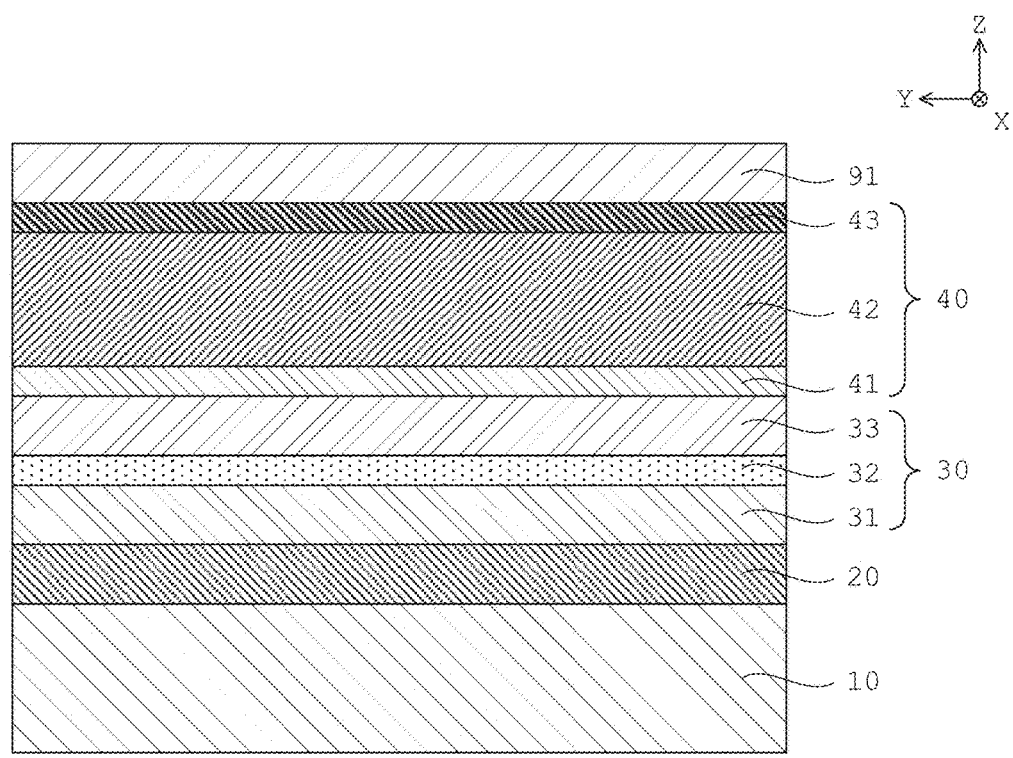

Next, as shown in FIG. 2B, by, for example, a thermal CVD method, an insulation film, which is a $SiO_2$ film having a thickness of 0.3 μm, is formed as a protection film 91 on the p-side contact layer 43.

Figure 3A:
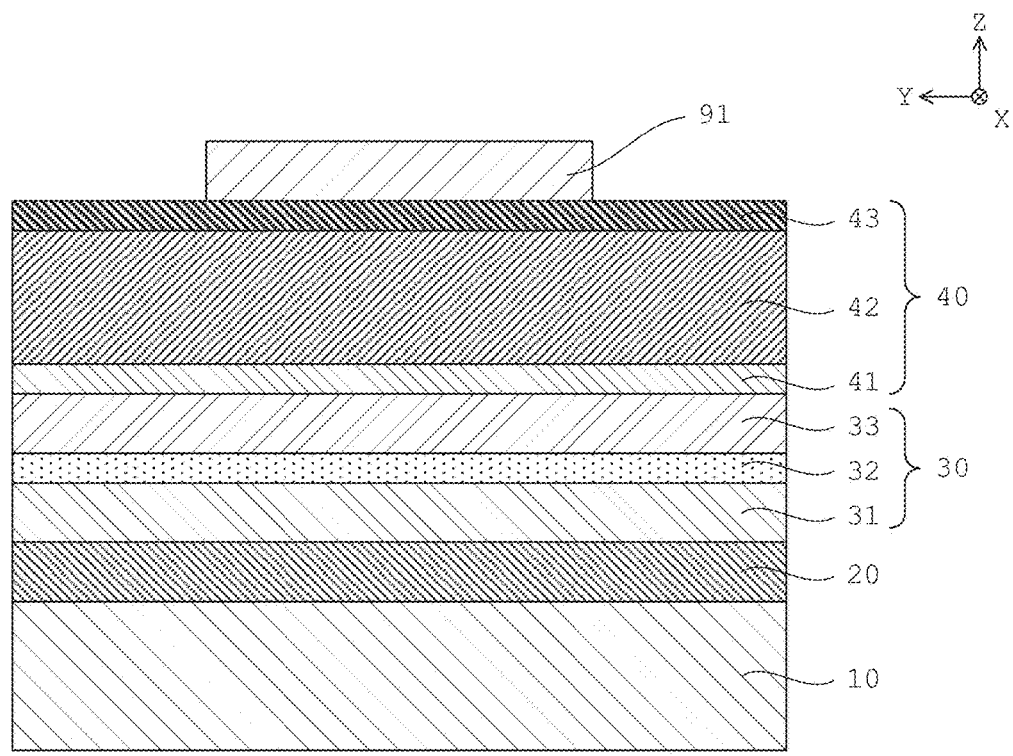
FIGS. 3A, 3B are each a cross-sectional view for describing the production method of the semiconductor light-emitting element according to Embodiment 1.

Next, as shown in FIG. 3A, by, for example, a photolithography method and an etching method using hydrofluoric acid, etching is performed such that the protection film 91 has a stripe shape and the other region is removed. At this time, in consideration of forming the end face 1a, 1b by utilizing a natural cleavage plane (m plane) of a hexagonal nitride semiconductor, the orientation of the stripe is set to be parallel to the m-axis direction.

Figure 3B:
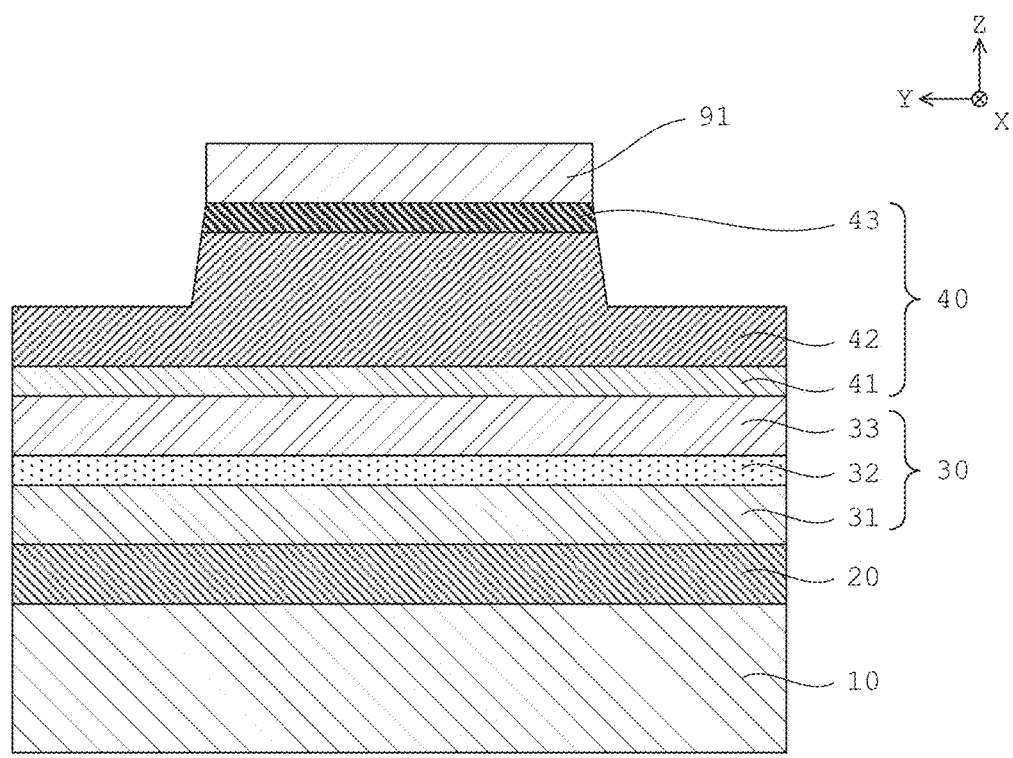

Next, as shown in FIG. 3B, by, for example, an inductively coupled plasma (ICP) etching method, un upper portion of the laminated structure body is etched to a depth of 0.4 μm using the protection film 91 as a mask, whereby a ridge stripe part is formed from upper portions of the p-side contact layer 43 and the p-side clad layer 42.

Figure 4A:
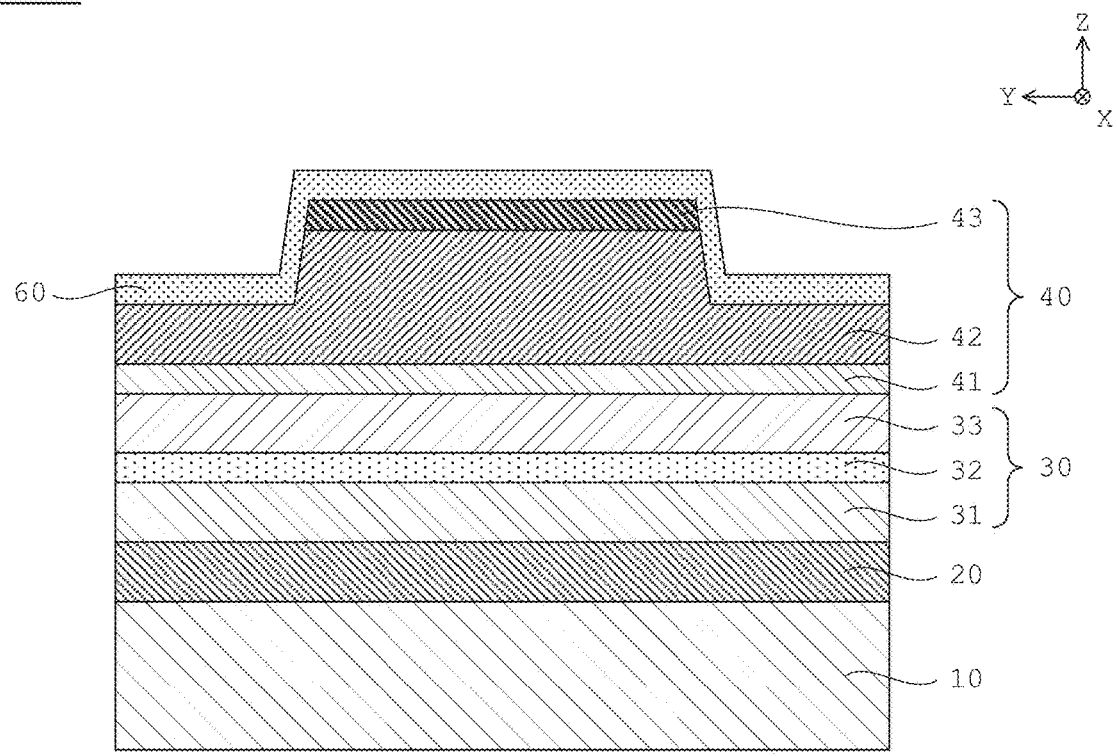
FIGS. 4A, 4B are each a cross-sectional view for describing the production method of the semiconductor light-emitting element according to Embodiment 1.

Next, as shown in FIG. 4A, the protection film 91 having the stripe shape is removed using hydrofluoric acid, for example. Then, by, for example, a thermal CVD method, the insulation film 60, which is a $SiO_2$ film having a thickness of 200 nm, is formed on the exposed p-side clad layer 42, over the entire surface thereof including the ridge stripe part.

Figure 4B:
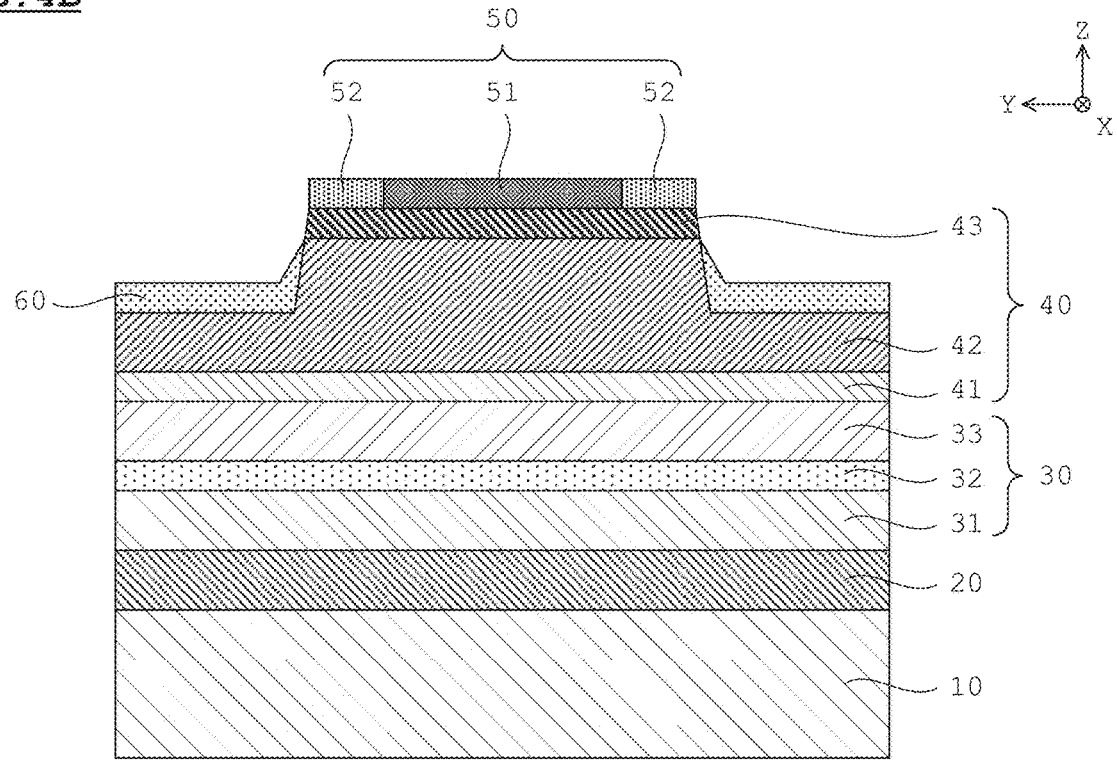

Next, as shown in FIG. 4B, by, for example, a photolithography method and an etching method using hydrofluoric acid, only the insulation film 60 on the p-side contact layer 43 is removed, to expose the upper face of the p-side contact layer 43. Then, by photolithography using a photoresist, an ITO electrode is formed as the first electrode 51, on the upper face (the entire surface of the top of the ridge stripe) of the p-side contact layer 43. Then, by photolithography using a photoresist, the first electrode 51 is etched so as to have the shape of the first waveguide 82a. For this etching, a mixture of phosphoric acid, nitric acid, and acetic acid can be used, for example.

Then, further, by photolithography using a photoresist, and by, for example, an electron beam (EB) vapor deposition method, a metal laminate film composed of, for example, palladium having a thickness of 40 nm and platinum having a thickness of 35 nm is formed as each second electrode 52, at least on the exposed p-side contact layer 43. Then, by a lift-off method that removes the resist pattern, the metal laminate film other than that at the position corresponding to the taper waveguide 82 is removed.

Figure 5A:
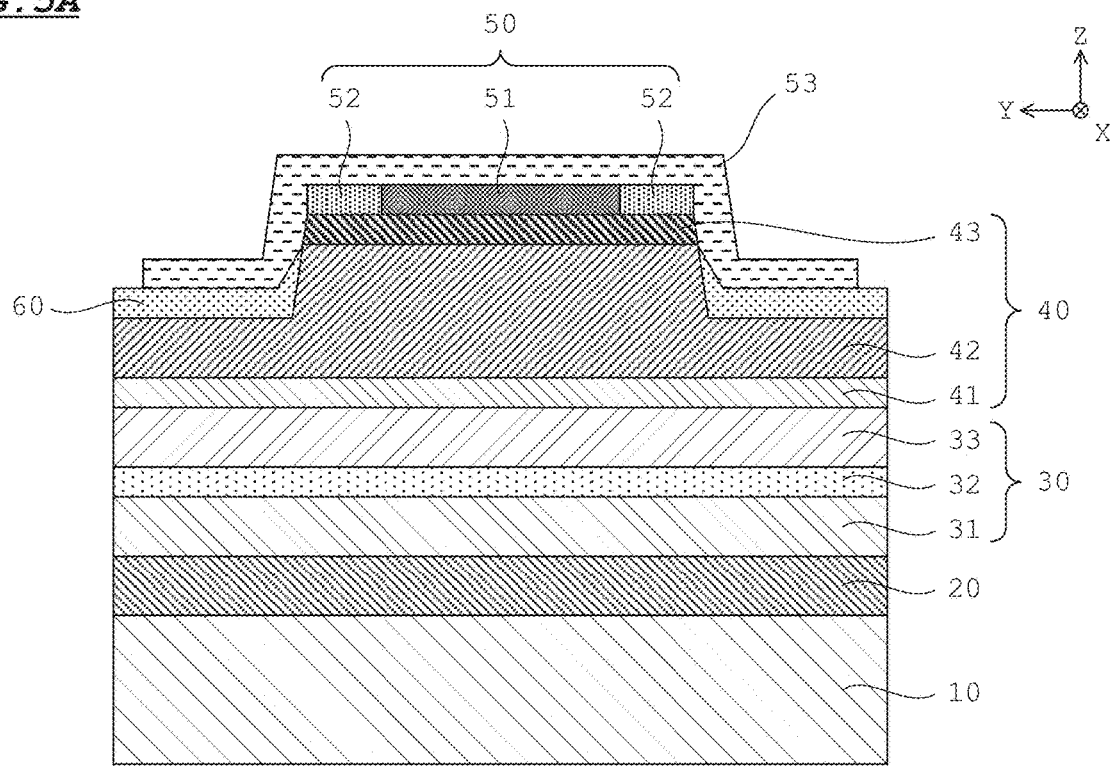
FIGS. 5A, 5B are each a cross-sectional view for describing the production method of the semiconductor light-emitting element according to Embodiment 1.

Next, as shown in FIG. 5A, by a lithography method and a lift-off method, the pad electrode 53 composed of Ti/Pt/Au and having a length in the X-axis direction of 900 μm and a length in the Y-axis direction of 150 μm, for example, is selectively formed so as to cover the tops of the electrode part 50 and the insulation film 60. Here, the pad electrode 53 is formed as a metal laminate film of titanium/platinum/gold respectively having thicknesses of 100 nm, 35 nm, and 1500 nm. Then, the lower face of the substrate 10 is polished with a diamond slurry, to thin the substrate 10 so as to have a thickness of about 100 μm.

Figure 5B:
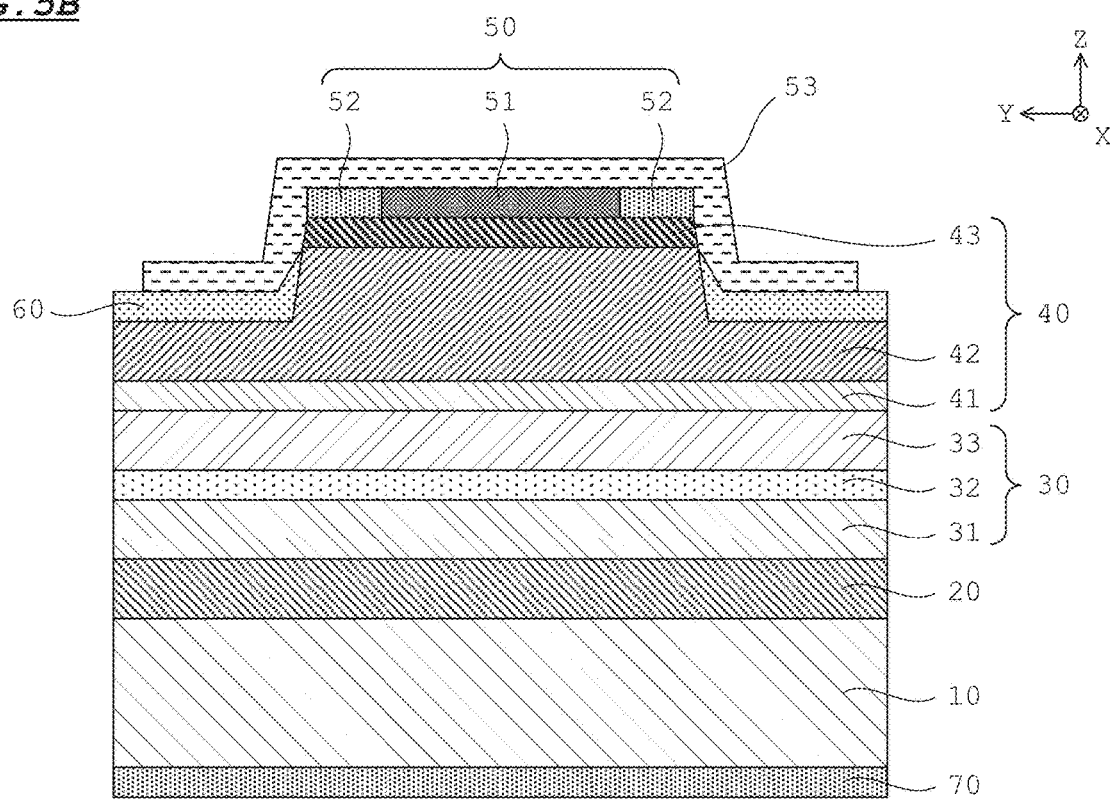

Next, as shown in FIG. 5B, by, for example, an EB vapor deposition method, a metal laminate film composed of, for example, Ti having a thickness of 5 nm, platinum having a thickness of 10 nm, and Au having a thickness of 1000 nm is formed on the lower face of the substrate 10, whereby the n-side electrode 70 is formed.

Next, the semiconductor light-emitting element having been subjected to the production steps up to that in FIG. 5B is cleaved (primary cleavage) along the m plane such that the length in the m-axis direction is, for example, 1000 μm. Subsequently, by, for example, an electron cyclotron resonance (ECR) sputtering method, the end face 1a is formed by forming a front coat film for a cleavage plane from which a laser beam is emitted, and the end face 1b is formed by forming a rear coat film for a cleavage plane on the opposite side. The reflectance of the end face 1a, 1b is set through adjustment of the material, configuration, film thickness, etc., of the coat film. Here, in order to obtain high-efficiency laser characteristics, the reflectance of the end face 1a on the front side is set to 5%, and the reflectance of the end face 1b on the rear side is set to 95%. Preferably, the reflectance of the end face 1a is set to about 0.1% to 18%, and the reflectance of the end face 1b is set to not less than 90%. Subsequently, the semiconductor light-emitting element having been subjected to primary cleavage is cleaved (secondary cleavage) such that the pitch, in terms of the length in the a-axis direction, is 400 μm, for example. Accordingly, the semiconductor light-emitting element 1 shown in FIGS. 1A, 1B is completed.

Figure 6:
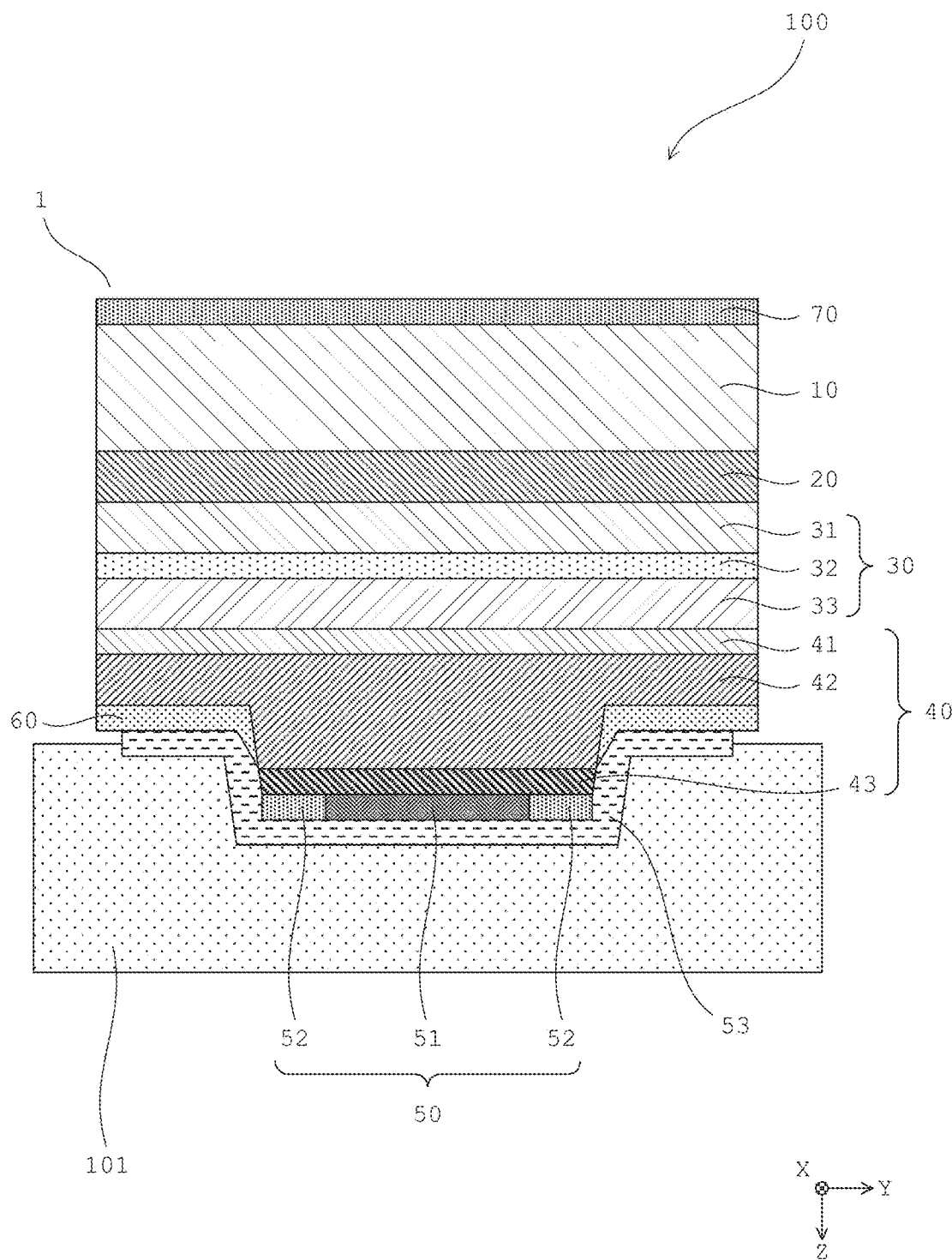
FIG. 6 is a cross-sectional view schematically showing a configuration of a semiconductor light-emitting device according to Embodiment 1.

FIG. 6 is a cross-sectional view schematically showing a configuration of a semiconductor light-emitting device 100.

The semiconductor light-emitting device 100 includes the semiconductor light-emitting element 1 and a submount 101. The electrode part 50 side of the semiconductor light-emitting element 1 is fused to the submount 101 which is composed of SiC of which the surface is Au metal coated and an AuSn solder. Accordingly, the semiconductor light-emitting device 100 is completed.

The semiconductor light-emitting device 100 shown in FIG. 6 is in a form (junction down mounting) in which the electrode part 50 of the semiconductor light-emitting element 1 is connected to the submount 101. However, not limited thereto, a form (junction up mounting) in which the n-side electrode 70 of the semiconductor light-emitting element 1 is connected to the submount 101 may be adopted. Further, the semiconductor light-emitting device 100 may be in a form in which separate submounts are respectively connected to the electrode part 50 and the n-side electrode 70.

Next, with reference to FIG. 7 to FIG. 9C, an equivalent refractive index set for the taper waveguide 82 is described. The equivalent refractive index is a refractive index that substantially acts on light, and is a refractive index defined for light that propagates in the semiconductor light-emitting element 1.

Figure 7:
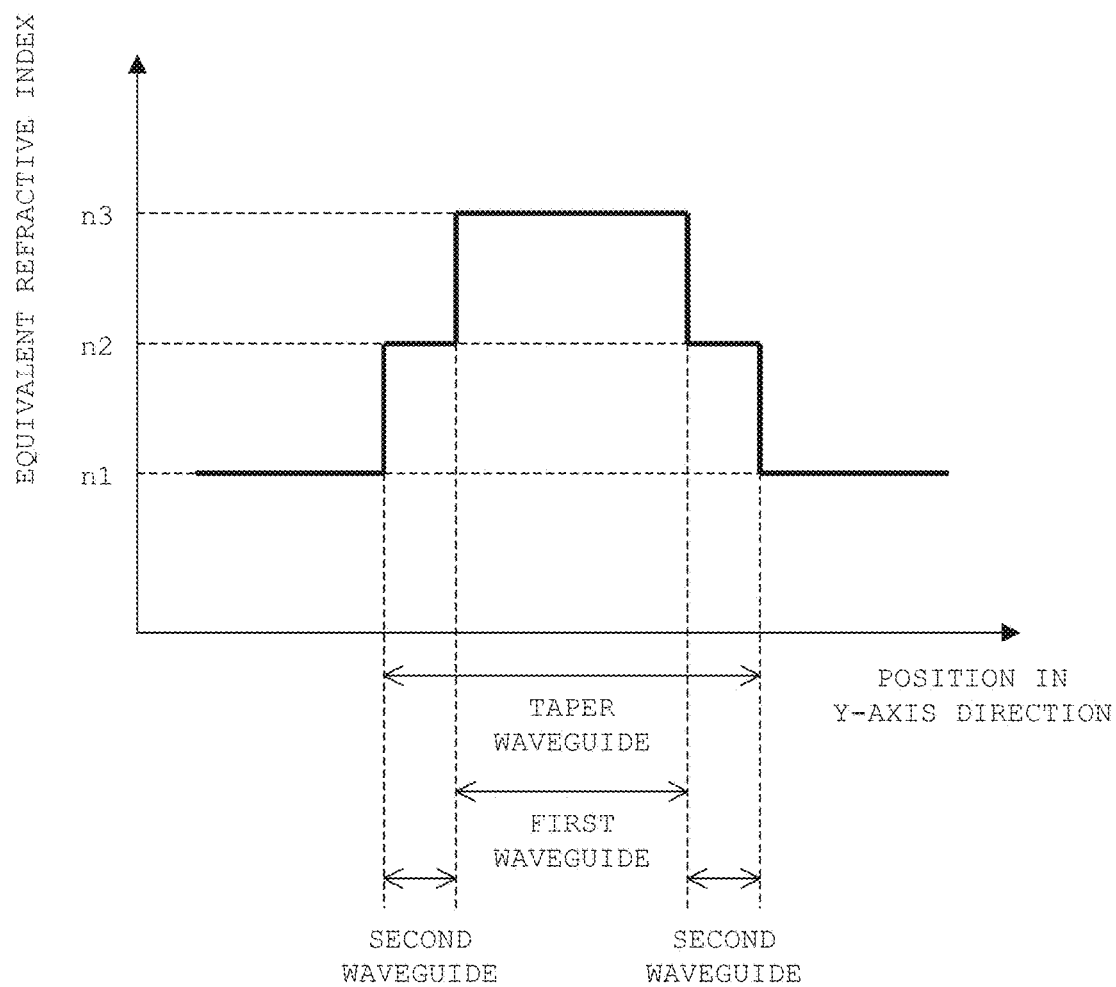
FIG. 7 is a graph showing an equivalent refractive index in a taper waveguide according to Embodiment 1.

FIG. 7 is a graph showing an equivalent refractive index in the taper waveguide 82.

As shown in FIG. 7, the equivalent refractive index on the outer sides in the Y-axis direction of the taper waveguide 82 is n1, the equivalent refractive index in each second waveguide 82b is n2, and the equivalent refractive index in the first waveguide 82a is n3. The relationship between n1, n2, and n3 is n1<n2<n3.

In Embodiment 1, the refractive indexes of the first electrode 51 and each second electrode 52 shown in FIG. 1B are adjusted, whereby the equivalent refractive index of the taper waveguide 82 is set as shown in FIG. 7. That is, the refractive indexes of the first electrode 51 and the second electrode 52 are set such that the equivalent refractive index of the taper waveguide 82 is higher in the first waveguide 82a than in the second waveguide 82b. In the configuration of Embodiment 1, the equivalent refractive index of the taper waveguide 82 becomes higher, in a stepwise manner, at the center with respect to the outer sides in the Y-axis direction.

Here, with reference to FIGS. 8A to 8C, a comparative example when the equivalent refractive index of the taper waveguide 82 is set to be constant is described.

FIG. 8A is a graph showing an equivalent refractive index of a taper waveguide in the case of the comparative example. In the comparative example, the equivalent refractive index in the taper waveguide is set to n2, which is constant.

FIGS. 8B, 8C each show a result of a wave-guiding simulation performed according to a beam propagation method (BPM) in the comparative example. FIG. 8B shows a forward wave advancing in the X-axis positive direction in the taper waveguide. FIG. 8C shows a backward wave advancing in the X-axis negative direction in the taper waveguide. The equivalent refractive index at B-B' in FIG. 8B is set as shown in FIG. 8A. In FIG. 8C, the taper waveguide is shown in a left-right reversed state for convenience.

As shown in FIG. 8B, in the comparative example, the forward wave having advanced from the straight waveguide to the taper waveguide spreads in a spherical shape. Therefore, the equiphase wave surface (wave front) of the forward wave is in an arc shape on the X-Y plane. When the forward wave of which the equiphase wave surface is in an arc shape is reflected at the end face on the X-axis positive side of the semiconductor light-emitting element, the backward wave advancing toward the straight waveguide in the taper waveguide is disturbed due to interference as shown in FIG. 8C. At this time, for example, when the forward wave having advanced in the direction of the dash-dot-line arrow in FIG. 8B is reflected at the end face, the reflected forward wave is incident at a large incidence angle on the boundary of the taper waveguide as indicated by the dash-dot-line arrow in FIG. 8C. As a result, the backward wave is dissipated from the taper waveguide as indicated by the dash-dot-line arrow in FIG. 8C. Therefore, in the regions each surrounded by a broken line in FIG. 8C, dissipation similar to the above occurs. Such dissipation of light from the waveguide causes a situation where the light emission efficiency of the semiconductor light-emitting device 100 is reduced.

In contrast, in Embodiment 1, in order to enhance the light emission efficiency, the equivalent refractive index of the taper waveguide 82 is set so as to be greater in the first waveguide 82a than in each second waveguide 82b as shown in FIG. 9A (as shown with reference to FIG. 7).

FIGS. 9B, 9C each show a result of a wave-guiding simulation performed according to a beam propagation method (BPM) in Embodiment 1. FIG. 9B shows a forward wave advancing in the X-axis positive direction in the taper waveguide 82. FIG. 9C shows a backward wave advancing in the X-axis negative direction in the taper waveguide 82. The equivalent refractive index at B-B' in FIG. 9B is set as shown in FIG. 9A. In FIG. 9C, the taper waveguide 82 is shown in a left-right reversed state for convenience.

As shown in FIG. 9B, in Embodiment 1, the equiphase wave surface (wave front) of the forward wave having advanced from the straight waveguide 81 to the taper waveguide 82 is in a linear shape that is parallel to the Y-axis direction on the X-Y plane. That is, since the equivalent refractive index of the first waveguide 82a at the center is higher than the equivalent refractive index of the second waveguides 82b on the outer sides, the speed of light advancing in the first waveguide 82a is slower than the speed of light advancing in the second waveguides 82b. Accordingly, the optical propagation distance of light advancing at the center of the taper waveguide 82 and the optical propagation distance of light advancing on the outer sides of the taper waveguide 82 are substantially equal to each other. Therefore, the phase of light advancing at the center and the phase of light advancing on the outer sides are aligned. As a result, as shown in FIG. 9B, the equiphase wave surface has a linear shape that is parallel to the Y-axis direction on the X-Y plane.

When the forward wave of which the equiphase wave surface is in a linear shape is reflected at the end face 1a on the X-axis positive side of the semiconductor light-emitting element 1, the equiphase wave surface of the backward wave advancing from the taper waveguide 82 to the straight waveguide 81 also has a linear shape as shown in FIG. 9C, which is different from the comparative example. That is, in Embodiment 1, the phases of the forward wave are aligned in a linear shape parallel to the Y-axis direction at least at the end face 1a, and the end face 1a is a face parallel to the Y-Z plane. Accordingly, the phase of the forward wave and the phase of the backward wave become optically in symmetry with respect to the end face 1a. Thus, the equiphase wave surface of the backward wave reflected at the end face 1a will also be in a linear shape, similar to the forward wave. Therefore, in Embodiment 1, different from the comparative example, the backward wave is suppressed from being dissipated from the taper waveguide 82 as shown in FIG. 9C.

Effects of Embodiment 1

According to Embodiment 1, the following effects are exhibited.

The straight waveguide 81 and the taper waveguide 82 cause light generated in the light guide layer 30 to propagate in the X-axis direction. In addition, as shown in FIG. 7, the equivalent refractive index at the center (the first waveguide 82a) in the Y-axis direction in the taper waveguide 82 is set to be higher than the equivalent refractive index on the outer sides (second waveguides 82b) in the taper waveguide 82. Therefore, the wave front of light that can be a spherical wave when the equivalent refractive index of the taper waveguide 82 is constant can be close to a wave front in a planar shape. Through the adjustment of the equivalent refractive index in the taper waveguide 82 as described above, the speed of light advancing at the center in the taper waveguide 82 becomes slower than the speed of light advancing on the outer sides in the taper waveguide 82. Therefore, the optical propagation distance of light advancing at the center in the taper waveguide 82 and the optical propagation distance of light advancing on the outer sides in the taper waveguide 82 become substantially equal to each other.

As a result, the phases of the light advancing in the taper waveguide 82 are aligned, and thus, the wave front of light can be close to a wave front in a planar shape at the end face 1a of the taper waveguide 82. Therefore, as for the incidence and reflection of light with respect to the end face 1a, the phase of the forward wave and the phase of the backward wave become optically in symmetry with respect to the end face 1a, and thus, the light reflected at the end face 1a can be suppressed from being dissipated from the taper waveguide 82. Accordingly, the light emission efficiency of the semiconductor light-emitting device 100 can be enhanced.

As shown in FIGS. 1A, 1B, the taper waveguide 82 includes: the first waveguide 82a formed at the center in the width direction (the Y-axis direction); and the second waveguides 82b formed on both sides in the width direction with respect to the first waveguide 82a, and the equivalent refractive index of the first waveguide 82a is higher than the equivalent refractive index of each second waveguide 82b. Thus, when the first waveguide 82a and the second waveguide 82b are formed so as to have different equivalent refractive indexes from each other, the equivalent refractive index can be changed between the center and the outer side in the taper waveguide 82 in a simple manner.

Here, the taper waveguide 82 extends in a taper shape (i.e., radially) such that the width thereof in the width direction (the Y-axis direction) is increased in symmetry with respect to the central axis of the taper waveguide 82, toward the end face 1a, and the first waveguide 82a and the second waveguides 82b are formed in symmetry with respect to the central axis in the width direction. Accordingly, the phases of light advancing in the Y-axis direction in the taper waveguide 82 can be smoothly aligned.

The first waveguide 82a extends in a taper shape (i.e., radially) such that the width thereof in the width direction (the Y-axis direction) is increased in symmetry with respect to the central axis of the taper waveguide 82, toward the end face 1a. Accordingly, out of the light advancing while spreading in the taper waveguide 82 toward the end face 1a, light in a substantially constant proportion passes the first waveguide 82a up to the end face 1a. Therefore, the phases of light advancing in the taper waveguide 82 can be smoothly aligned.

In the present embodiment, as shown in FIG. 1B, the first electrode 51 is disposed at a position corresponding to the first waveguide 82a, and the second electrodes 52 are disposed at positions corresponding to the second waveguides 82b. The first electrode 51 is formed from a material having a refractive index higher than that of each second electrode 52. Thus, through the adjustment of the refractive index of the first electrode 51 and the refractive index of the second electrode 52, the first waveguide 82a having a high equivalent refractive index and the second waveguide 82b having a low equivalent refractive index can be formed in a simple manner.

Modification of Embodiment 1

In Embodiment 1 above, the first electrode 51 and each second electrode 52 that have the same thickness and that have different refractive indexes are disposed adjacent to each other in the X-Y plane such that the equivalent refractive index is changed stepwise in accordance with the position in the Y-axis direction of the taper waveguide 82, as shown in FIG. 7. However, not limited thereto, as shown in a modification in FIGS. 10A, 10B, the thickness of the electrode part 50 may be configured such that the equivalent refractive index is gradually changed in accordance with the position in the Y-axis direction of the taper waveguide 82.

Figure 10A:
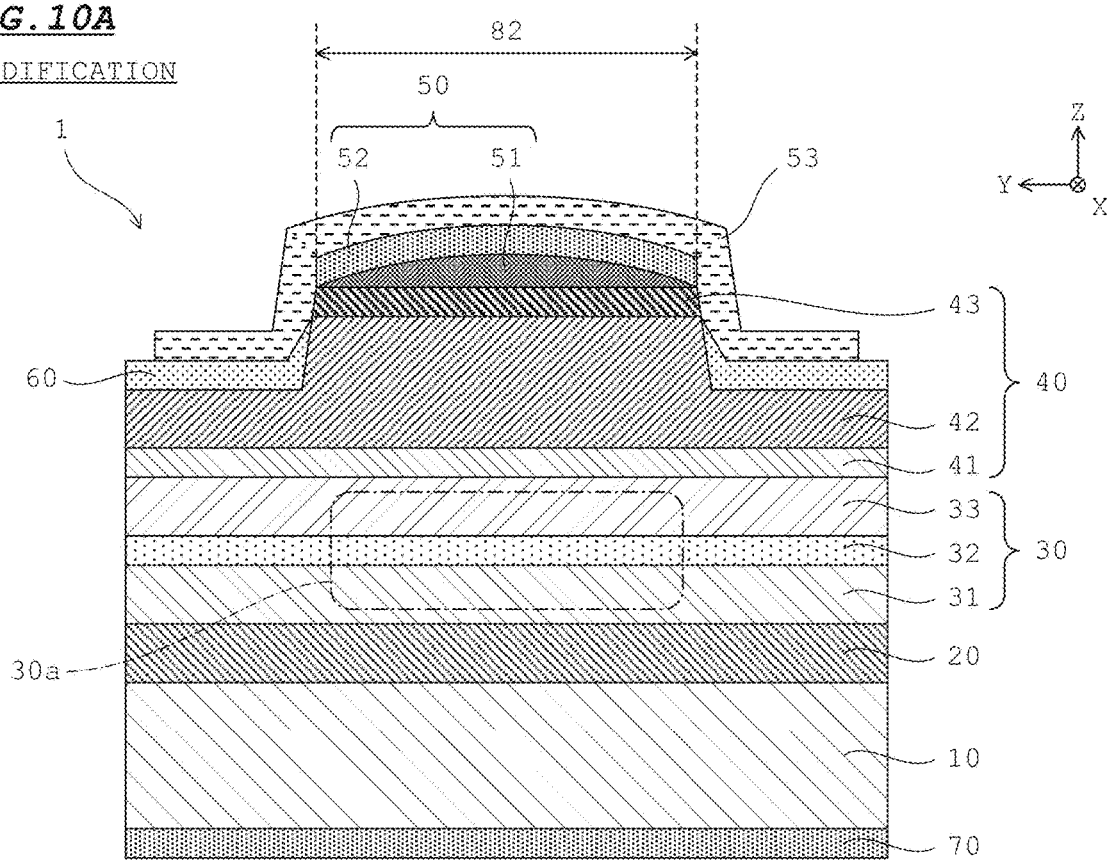
FIG. 10A is a cross-sectional view schematically showing a configuration of a semiconductor light-emitting element according to a modification of Embodiment 1.

FIG. 10A is a cross-sectional view schematically showing a configuration of the semiconductor light-emitting element 1 according to the present modification. In the present modification, the first electrode 51 and the second electrode 52 are disposed in the lamination direction. The first electrode 51 is disposed over the entirety of the upper face of the p-side contact layer 43, and the second electrode 52 is disposed over the entirety of the upper face of the first electrode 51. The thickness of the first electrode 51 is increased from the outer sides toward the center in the Y-axis direction in the taper waveguide 82. The thickness of the second electrode 52 is constant irrespective of the position in the Y-axis direction.

Figure 10B:
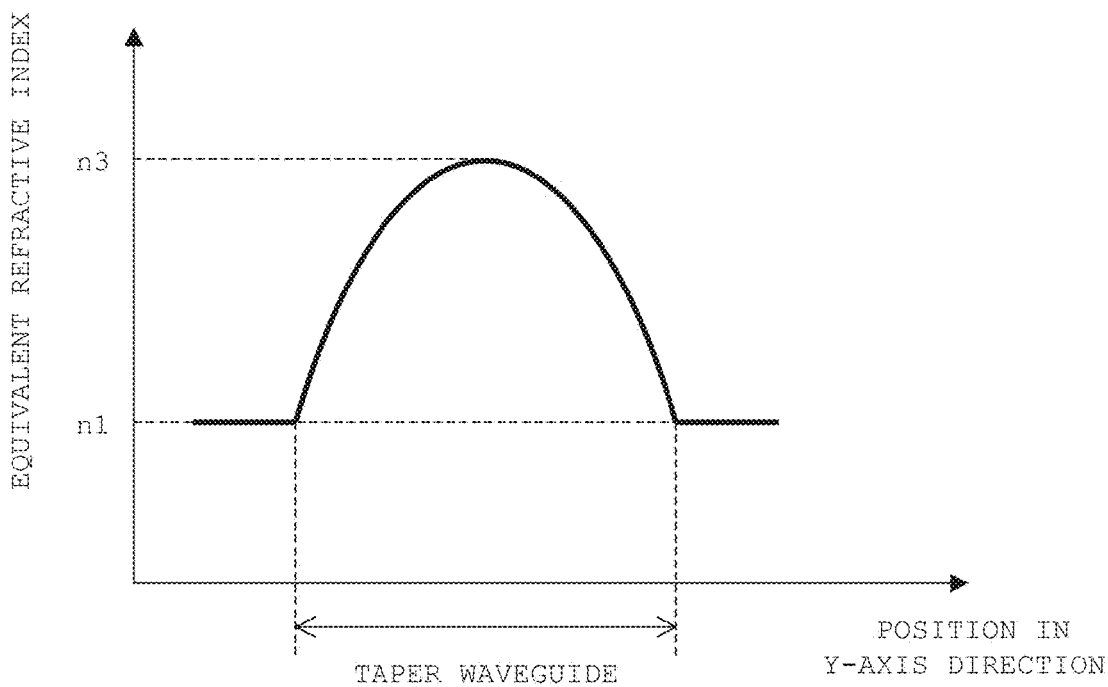
FIG. 10B is a graph showing an equivalent refractive index of a taper waveguide according to the modification of Embodiment 1.

FIG. 10B is a graph showing an equivalent refractive index in the taper waveguide 82 according to the present modification. In the present modification, the equivalent refractive index in the taper waveguide 82 is gradually increased from n1 on the outer sides toward the center, and the equivalent refractive index is n3 at the center in the Y-axis direction of the taper waveguide 82. In the present modification, the thickness of the first electrode 51 is set such that the equivalent refractive index in the Y-axis direction of the taper waveguide 82 transitions in the manner as indicated by the graph in FIG. 10B.

When the equivalent refractive index of the taper waveguide 82 is increased from the outer sides toward the center in the width direction (the Y-axis direction) in the taper waveguide 82, the phases of light advancing in the taper waveguide 82 can be aligned with higher accuracy. Therefore, the light emission efficiency of the semiconductor light-emitting device 100 can be further enhanced. In addition, through the adjustment of the thickness of the first electrode 51 having a high refractive index, the equivalent refractive index can be adjusted smoothly and in a simple manner.

In the configuration shown in FIG. 10A, the electrode part 50 may be composed only of the first electrode 51, or alternatively, only of the second electrode 52. Also, when the electrode part 50 is composed of the first electrode 51 or the second electrode 52, the electrode part 50 is configured such that the thickness is increased from the outer sides toward the center in the Y-axis direction in the taper waveguide 82. Accordingly, the equivalent refractive index of the taper waveguide 82 can be set on the basis of the thickness of the electrode part 50 in a simple manner, so as to be similar to that indicated by the graph in FIG. 10B. In this case, since the first electrode 51 is an ITO electrode as described above, when the electrode part 50 is composed only of the first electrode 51, absorption of light by the electrode part 50 is more suppressed than when the electrode part 50 is composed only of the second electrode 52, and accordingly, the emission efficiency of the semiconductor light-emitting element 1 can be enhanced.

In the graph shown in FIG. 10B, from the boundary portions on the outer sides of the taper waveguide 82 toward the inside of the taper waveguide 82, the value of the equivalent refractive index is significantly increased. However, not limited thereto, the equivalent refractive index of the taper waveguide 82 may be in a shape like a Gaussian distribution in which the value in the lower portion gradually approaches n1.

Embodiment 2

In Embodiment 1 above, as shown in FIG. 1B, the first electrode 51 and each second electrode 52 having different refractive indexes from each other are arranged in the Y-axis direction, whereby the equivalent refractive index of the taper waveguide 82 is changed stepwise in the Y-axis direction as shown in FIG. 7. In contrast, in the present embodiment, the thickness of the p-side clad layer 42 is changed stepwise in the Y-axis direction, whereby the equivalent refractive index of the taper waveguide 82 is changed stepwise in the Y-axis direction.

FIG. 11A is a cross-sectional view schematically showing a configuration of the semiconductor light-emitting element 1 according to Embodiment 2. In Embodiment 2, the thickness of the p-side clad layer 42 disposed at a position corresponding to the taper waveguide 82 is different in accordance with the position in the Y-axis direction. That is, the thickness of the p-side clad layer 42 disposed at the position corresponding to the first waveguide 82a is greater than the thickness of the p-side clad layer 42 disposed at a position corresponding to each second waveguide 82b.

When the semiconductor light-emitting element 1 of Embodiment 2 is to be produced, from the state shown in FIG. 4A, the insulation film 60 in the region corresponding to each second waveguide 82b is etched by a photolithography method and an etching method using hydrofluoric acid. Subsequently, by an inductively coupled plasma (ICP) etching method, the region corresponding to the second waveguide 82b is etched to a depth of 0.2 μm from the top. Subsequently, the insulation film 60 is removed using hydrofluoric acid, and again, by a thermal CVD method, an insulation film 60, which is a $SiO_2$ film having a thickness of 200 nm, is formed over the entire surface including the ridge stripe part. The ICP etching as described above is repeated twice, whereby the laminated structure corresponding to the second waveguide 82b is etched by 0.4 μm from the top, and the laminated structure corresponding to the first waveguide 82a is etched by 0.2 μm from the top.

Thereafter, through a procedure similar to that in Embodiment 1, a second electrode 52 is formed on the upper face of the p-side clad layer 42 and the upper face of the p-side contact layer 43 (the entire surface of the top of the ridge stripe), and the pad electrode 53 is formed so as to cover the tops of the second electrode 52 and the insulation film 60. Accordingly, the semiconductor light-emitting element 1 in FIG. 11A is completed.

Also in Embodiment 2, the thickness in the Y-axis direction of the p-side clad layer 42 is different stepwise. Therefore, the equivalent refractive index of the taper waveguide 82 can be set in a manner similar to that in the graph in FIG. 7 shown in Embodiment 1. In Embodiment 2, through the adjustment of the thickness of the p-side clad layer 42, the first waveguide 82a having a high equivalent refractive index and the second waveguide 82b having a low equivalent refractive index can be formed in a simple manner. Similar to Embodiment 1, since the phases of light advancing in the taper waveguide 82 are aligned, the phases of light passing through the taper waveguide 82 and reflected at the end face 1a are also aligned. Therefore, the light reflected at the end face 1a can be suppressed from being dissipated from the taper waveguide 82, and thus, the light emission efficiency of the semiconductor light-emitting device 100 can be enhanced.

When an ITO electrode is used as in Embodiment 1, the resistance value between the ITO electrode and the p-side contact layer 43 is increased, and accordingly, power consumption of the semiconductor light-emitting device 100 is increased. In contrast, in Embodiment 2, since no ITO electrode is used, power consumption of the semiconductor light-emitting device 100 can be suppressed when compared with a case where an ITO electrode is used.

Modification of Embodiment 2

In Embodiment 2, as shown in FIG. 11A, the thickness of the p-side clad layer 42 is set such that the equivalent refractive index is changed stepwise in accordance with the position in the Y-axis direction of the taper waveguide 82. However, not limited thereto, as shown in a modification in FIG. 11B, the thickness of the p-side clad layer 42 may be set such that the equivalent refractive index is gradually changed in accordance with the position in the Y-axis direction of the taper waveguide 82.

FIG. 11B is a cross-sectional view schematically showing a configuration of the semiconductor light-emitting element 1 according to the present modification. In the present modification, the thickness of the p-side clad layer 42 is increased from the outer sides toward the center in the Y-axis direction. The p-side contact layer 43 is disposed over the entirety of the upper face of the p-side clad layer 42, and the second electrode 52 is disposed over the entirety of the upper face of the p-side contact layer 43. The thicknesses of the p-side contact layer 43 and the second electrode 52 are constant irrespective of the position in the Y-axis direction.

Also, in the present modification, the thickness of the p-side clad layer 42 in the Y-axis direction is gradually changed. Therefore, the equivalent refractive index of the taper waveguide 82 can be set in a manner similar to that in the graph in FIG. 10B. Therefore, also in the present modification, similar to the modification of Embodiment 1, the phases of light advancing in the taper waveguide 82 can be aligned with high accuracy. Therefore, the light emission efficiency of the semiconductor light-emitting device 100 can be further enhanced. In addition, through the adjustment of the thickness of the p-side clad layer 42, the equivalent refractive index of the taper waveguide 82 can be easily set to the state equivalent to that in the graph in FIG. 10B.

Embodiment 3

In Embodiment 1 above, as shown in FIG. 1B, the first electrode 51 and each second electrode 52 having different refractive indexes from each other are arranged in the Y-axis direction, whereby the equivalent refractive index of the taper waveguide 82 is changed stepwise in the Y-axis direction. In contrast, in the present embodiment, in a layout similar to that in FIG. 1B, electrodes of which the refractive indexes are equal to each other are disposed in the taper waveguide 82, and different current controls are performed for the respective electrodes, whereby the equivalent refractive index of the taper waveguide 82 is changed stepwise in the Y-axis direction.

FIG. 12A is a top view schematically showing a configuration of the semiconductor light-emitting element 1 according to Embodiment 3, and FIG. 12B is a cross-sectional view schematically showing the configuration of the semiconductor light-emitting element 1 according to Embodiment 3. In FIG. 12A, the pad electrode 53 is not shown for convenience. FIG. 12B is a cross-sectional view in the X-axis positive direction of the semiconductor light-emitting element 1 cut along A-A' in FIG. 12A.

As shown in FIG. 12A, in the semiconductor light-emitting element 1 of Embodiment 3, a first electrode 54 and two second electrodes 55 are disposed in the taper waveguide 82, in a layout similar to that in FIG. 1A. The range corresponding to the first electrode 54 is the first waveguide 82a, and the ranges corresponding to the second electrodes 55 are the second waveguides 82b. An electrode 56 is disposed at the position corresponding to the straight waveguide 81.

As shown in FIG. 12B, an insulation film 57 is disposed between the first electrode 54 and each second electrode 55. The first electrode 54 and the second electrode 55 are each formed from a material similar to that of the second electrode 52 in Embodiment 1. Each insulation film 57 is formed from a material similar to that of the insulation film 60, for example. Each insulation film 57 is provided above the p-side contact layer 43 so as to provide electrical insulation between the first electrode 54 and the corresponding second electrode 55, and so as to provide electrical insulation between the pad electrode 53 above the first electrode 54 and the pad electrode 53 above the corresponding second electrode 55. When the semiconductor light-emitting device 100 is to be formed, the semiconductor light-emitting element 1 is mounted on the submount 101 such that different current controls can be individually performed for the first electrode 54, the second electrodes 55, and the electrode 56.

In the present embodiment, since the refractive indexes of the first electrode 54 and each second electrode 55 are the same with each other, the equivalent refractive indexes of the first waveguide 82a and each second waveguide 82b in terms of the structure are the same with each other. In the present embodiment, current densities of the first electrode 54 and the second electrode 55 are controlled to change the refractive index of the semiconductor layer in the waveguide, whereby the equivalent refractive index of the first waveguide 82a and the second waveguide 82b is changed stepwise.

Figure 13A:
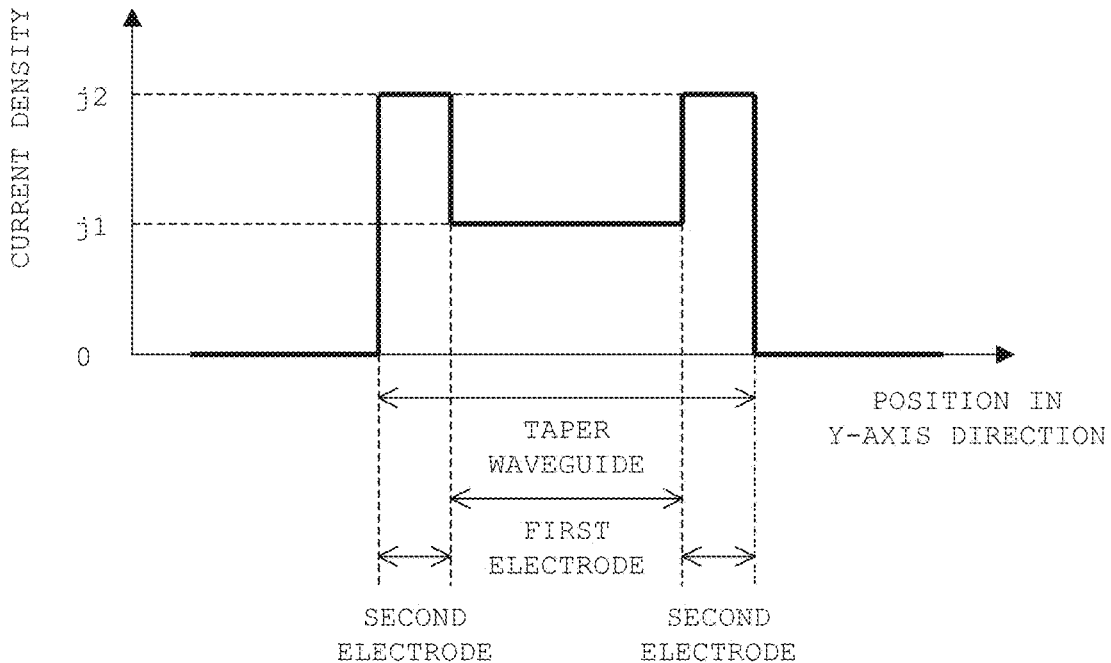
FIG. 13A is a graph showing current density in a first electrode and a second electrode according to Embodiment 3.

FIG. 13A is a graph showing current density in the first electrode 54 and the second electrodes 55.

Figure 13B:
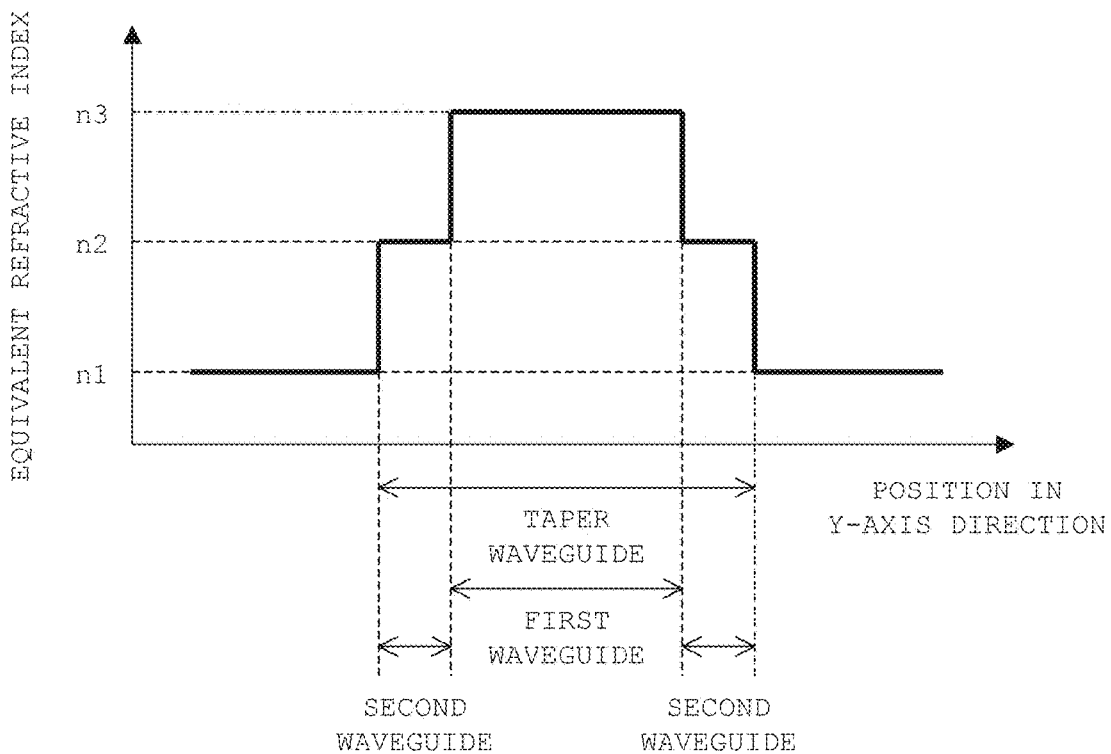
FIG. 13B is a graph showing an equivalent refractive index in a taper waveguide according to Embodiment 3.

As shown in FIG. 13A, current controls are performed on the first electrode 54 and each second electrode 55 such that the current density of the first electrode 54 becomes j1, and the current density of each second electrode 55 becomes j2, which is greater than j1. Accordingly, the refractive index of the semiconductor layer in the first waveguide 82*a* corresponding to the first electrode 54 becomes greater than the refractive index of the semiconductor layer in the second waveguides 82*b* corresponding to the second electrodes 55. Therefore, as shown in FIG. 13B, the equivalent refractive index of the first waveguide 82*a* becomes greater than the equivalent refractive index of the second waveguides 82*b*.

From the above, also in Embodiment 3, the equivalent refractive index can be set in a manner similar to that in Embodiment 1, and thus, the phases of light advancing in the taper waveguide 82 are aligned. Accordingly, the light reflected at the end face 1*a* can be suppressed from being dissipated from the taper waveguide 82, and thus, the light emission efficiency of the semiconductor light-emitting device 100 can be enhanced.

In the configuration shown in FIG. 12B, another insulation means may be provided instead of the insulation films 57. For example, instead of the insulation films 57, air gaps may be provided. In this case, an air gap is provided between the first electrode 54 and each second electrode 55, and an air gap is also provided between the pad electrode 53 above the first electrode 54 and the pad electrode 53 above each second electrode 55.

Embodiment 4

In Embodiments 1 to 3 above, the straight waveguide 81 and the taper waveguide 82 are connected to each other in the X-axis direction, and the taper waveguide 82 is composed of the first waveguide 82*a* and the second waveguides 82*b* in a taper shape, whereby the waveguide of the semiconductor light-emitting element 1 is formed. In contrast, in Embodiment 4, as shown in FIG. 14A, the end face 1*a* and the end face 1*b* are connected by a straight waveguide 200 extending in parallel to the X-axis direction.

FIG. 14A is a top view schematically showing a configuration the semiconductor light-emitting element 1 according to Embodiment 4.

The straight waveguide 200 includes first waveguides 201 and second waveguides 202. The first waveguides 201 extend from the center position of the straight waveguide 200, in the X-axis positive direction and in the X-axis negative direction, respectively, and the width in the Y-axis direction of each first waveguide 201 is increased in accordance with increase in the distance from the center position of the straight waveguide 200. The second waveguides 202 are positioned on the outer sides of the first waveguides 201, in the straight waveguide 200.

Also in Embodiment 4, as in Embodiment 1, the first electrode 51 is disposed at the position corresponding to each first waveguide 201, and the second electrode 52 is disposed at the position corresponding to each second waveguide 202. Similar to Embodiment 1, the refractive index of the first electrode 51 is higher than the refractive index of the second electrode 52. Therefore, the equivalent refractive index of the first waveguide 201 is higher than the equivalent refractive index of the second waveguide 202. That is, the equivalent refractive index of the straight waveguide 200 is higher at the center in the width direction than in the outer sides in the width direction.

Here, the straight waveguide 200 has a relatively large width in the Y-axis direction. Thus, when the equivalent refractive index of the straight waveguide 200 is uniform, light easily propagates in the X-axis direction while spreading in the Y-axis direction. Therefore, when the equivalent refractive index of the straight waveguide 200 is uniform, the phase of the forward wave easily extends in a spherical shape as in the case of the comparative example described with reference to FIGS. 8A to 8C. Therefore, the equiphase wave surface (wave front) of the forward wave easily has an arc shape on the X-Y plane.

In contrast, in the case of Embodiment 4, since the equivalent refractive index of the straight waveguide 200 is adjusted as described above, the phases of the forward wave advancing from the center position toward the end face 1*a* are easily aligned due to the difference in the equivalent refractive index of the first waveguide 201 and the second waveguides 202 that are positioned on the X-axis positive side with respect to the center position. Similarly, the phases of the backward wave advancing from the center position toward the end face 1*b* are also easily aligned due to the difference in the equivalent refractive index of the first waveguide 201 and the second waveguides 202 positioned on the X-axis negative side with respect to the center position. Therefore, also in Embodiment 4, the phase of light incident on the end face 1*a*, 1*b* and the phase of light reflected at the end face 1*a*, 1*b* easily become optically in symmetry with respect to the end face 1*a*, 1*b*. Accordingly, the light reflected at the end face 1*a*, 1*b* can be suppressed from being dissipated from the straight waveguide 200. Therefore, the light emission efficiency of the semiconductor light-emitting device 100 can be enhanced.

Modification of Embodiment 4

In Embodiment 4 above, as shown in FIG. 14A, the first waveguides 201 are provided on both of the X-axis positive side and the X-axis negative side with respect to the center position. However, not limited thereto, as shown in a modification in FIG. 14B, the first waveguide 201 may be provided on only the X-axis positive side with respect to the center position.

FIG. 14B is a top view schematically showing a configuration of the semiconductor light-emitting element 1 according to the present modification. In the present modification, the phases of the forward wave advancing from the center position toward the end face 1*a* are easily aligned due to the difference in the equivalent refractive index of the first waveguide 201 and the second waveguides 202 positioned on the X-axis positive side with respect to the center position. Therefore, when compared with a configuration in which only one type of electrode is disposed in the straight waveguide 200, the light reflected at the end face 1*a* can be suppressed from being dissipated from the straight waveguide 200. Thus, the light emission efficiency of the semiconductor light-emitting device 100 can be enhanced.

In Embodiment 4 above and the present modification, the method of making the equivalent refractive index of the first waveguide 201 and the equivalent refractive index of the second waveguide 202 different from each other is not limited to the method of disposing the first electrode 51 and the second electrode 52 having different refractive indexes from each other at the first waveguide 201 and the second waveguide 202, respectively. The methods described in the modification of Embodiment 1 above, Embodiment 2 above, and the modification thereof may be used.

<Other Modifications>

Although the embodiments of the present invention have been described above, the present invention is not limited to the above embodiments, and various other modifications may be made.

For example, in the embodiments above, the taper waveguide 82 and the straight waveguide 200 are configured such that the equivalent refractive index in the waveguide are changed in two steps. However, not limited thereto, the equivalent refractive index in the waveguide may be changed in three or more steps.

In the embodiments above, the first waveguide 82a, 201 is configured such that the width thereof in the Y-axis direction is gradually increased in accordance with a change of the position in the X-axis direction. That is, the boundary line between the first waveguide and the second waveguide extends in an oblique direction (radially) in a top view. However, not limited thereto, the boundary line between the first waveguide and the second waveguide may extend in parallel to the X-axis. Further, a part of the boundary line between the first waveguide and the second waveguide may extend in parallel to the X-axis or may extend in parallel to the Y-axis.

In Embodiments 1 to 3 above, the second waveguide 82b is provided from the connection portion between the straight waveguide 81 and the taper waveguide 82 up to the end face 1a. However, not limited thereto, the second waveguide 82b may be provided from a position separated in the X-axis positive direction by a predetermined distance from the connection portion, up to the end face 1a. That is, only the first waveguide 82a may be provided in a predetermined range in the X-axis positive direction from the connection portion between the straight waveguide 81 and the taper waveguide 82. In this case, as for the second waveguide 82b, the equivalent refractive index may be adjusted such that the phases of the forward wave are aligned at least at the end face 1a.

In Embodiments 1 to 3 above, a connection portion between the straight waveguide and the taper waveguide is provided near the center of the resonator. However, not limited thereto, the connection portion may be provided at a position separated in the X-axis direction by a predetermined distance from the connection portion. That is, the lengths of the straight waveguide 81 and the taper waveguide 82 can be adjusted as desired.

The semiconductor light-emitting device 100 may be used not only in processing of a product but also in another usage.

In addition to the above, various modifications can be made as appropriate to the embodiments of the present invention without departing from the scope of the technical idea defined by the claims.

DESCRIPTION OF THE REFERENCE CHARACTERS 1a, 1b end face
30 light guide layer (light-emitting layer)
42 p-side clad layer (clad layer)
50 electrode part (electrode)
51 first electrode
52 second electrode
54 first electrode
55 second electrode
82 taper waveguide (waveguide)
82a first waveguide
82b second waveguide
100 semiconductor light-emitting device
200 straight waveguide (waveguide)
201 first waveguide
202 second waveguide

The invention claimed is:

1. A semiconductor light-emitting device comprising:
a light-emitting layer; and
a waveguide configured to cause light generated in the light-emitting layer to propagate, wherein
an equivalent refractive index of the waveguide is, in a predetermined range from an end face of the waveguide, higher at a center in a width direction of the waveguide than on an outer side in the width direction of the waveguide,
the waveguide includes a first waveguide formed at the center in the width direction, and a second waveguide formed at each of both sides in the width direction with respect to the first waveguide,
an equivalent refractive index of the first waveguide is higher than an equivalent refractive index of the second waveguide,
the semiconductor light-emitting device further comprises:
a first electrode disposed at a position corresponding to the first waveguide; and
a second electrode disposed at a position corresponding to the second waveguide, and
the first electrode is formed from a material having a refractive index higher than that of the second electrode.

2. The semiconductor light-emitting device according to claim 1, wherein
the waveguide extends in a taper shape such that a width thereof in the width direction is increased in symmetry with respect to a central axis of the waveguide, toward the end face, and
the first waveguide and the second waveguide are formed in symmetry with respect to the central axis in the width direction.

3. The semiconductor light-emitting device according to claim 1, wherein
the waveguide extends in a linear shape in a propagation direction of the light.

4. The semiconductor light-emitting device according to claim 1, wherein
the first waveguide extends in a taper shape such that a width thereof in the width direction is increased in symmetry with respect to a central axis of the waveguide, toward the end face.

5. The semiconductor light-emitting device according to claim 1, comprising
a clad layer disposed above the light-emitting layer, wherein
a thickness of the clad layer disposed at a position corresponding to the first waveguide is greater than a thickness of the clad layer disposed at a position corresponding to the second waveguide.

6. A semiconductor light-emitting device comprising:
a light-emitting layer; and
a waveguide configured to cause light generated in the light-emitting layer to propagate, wherein
an equivalent refractive index of the waveguide is, in a predetermined range from an end face of the waveguide, higher at a center in a width direction of the waveguide than on an outer side in the width direction of the waveguide,
the equivalent refractive index of the waveguide is increased from the outer side toward the center in the width direction,
the semiconductor light-emitting device comprises an electrode disposed at a position corresponding to the waveguide, a thickness of the electrode is increased from the outer side toward the center in the width direction, the electrode includes a first electrode and a second electrode disposed in a lamination direction, the first electrode is formed from a material having a refractive index higher than that of the second electrode, and a thickness of the first electrode is increased from the outer side toward the center in the width direction.

7. The semiconductor light-emitting device according to claim 6, comprising a clad layer disposed above the light-emitting layer, wherein a thickness of the clad layer is increased from the outer side toward the center in the width direction.

* * * * *